United States Patent
Sato

(10) Patent No.: US 9,543,220 B2
(45) Date of Patent: Jan. 10, 2017

(54) SUBSTRATE PROCESSING APPARATUS, SEMICONDUCTOR DEVICE MANUFACTURING METHOD, SUBSTRATE PROCESSING METHOD, AND RECORDING MEDIUM

(71) Applicant: HITACHI KOKUSAI ELECTRIC INC., Tokyo (JP)

(72) Inventor: Takeo Sato, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/476,337

(22) Filed: Sep. 3, 2014

(65) Prior Publication Data

US 2014/0370628 A1 Dec. 18, 2014

Related U.S. Application Data

(63) Continuation of application No. PCT/JP2013/055126, filed on Feb. 27, 2013.

(30) Foreign Application Priority Data

Mar. 7, 2012 (JP) .................................. 2012-049992

(51) Int. Cl.
H01L 21/02 (2006.01)
H01L 21/66 (2006.01)
(Continued)

(52) U.S. Cl.
CPC ......... *H01L 22/12* (2013.01); *C23C 16/45551* (2013.01); *C23C 16/52* (2013.01);
(Continued)

(58) Field of Classification Search
None
See application file for complete search history.

(56) References Cited

U.S. PATENT DOCUMENTS

2006/0141782 A1* 6/2006 Hasebe ............... C23C 16/4408
438/680
2010/0280643 A1* 11/2010 Mochizuki ..................... 700/99

FOREIGN PATENT DOCUMENTS

CN 101276444 A * 10/2008
JP 04-142057 A 5/1992
(Continued)

OTHER PUBLICATIONS

A list of documents filed with WIPO, total page 2.*
(Continued)

*Primary Examiner* — Calvin Choi
*Assistant Examiner* — Xiaoming Liu
(74) *Attorney, Agent, or Firm* — Volpe and Koenig, P.C.

(57) ABSTRACT

According to the present disclosure, it is possible to prevent particles from being generated and to improve substrate processing quality. A substrate processing apparatus includes cassette mounting unit on which process substrate cassette and dummy substrate cassette are mounted, the process substrate cassette being configured to accommodate a plurality of process substrates, and the dummy substrate cassette being configured to accommodate a plurality of dummy substrates, process chamber configured to process the process substrates and the dummy substrates, substrate support unit installed within the process chamber and provided with a plurality of substrate mounting portions where the process substrates and the dummy substrates are mounted, transfer unit configured to transfer the process substrates and the dummy substrates between the cassette mounting unit and the process chamber, and control unit configured to control substrate processing and to transfer processing of the process substrates and the dummy substrates.

10 Claims, 7 Drawing Sheets

(51) Int. Cl.
  *H01L 21/67*    (2006.01)
  *C23C 16/455*   (2006.01)
  *C23C 16/52*    (2006.01)
  *H01L 21/677*   (2006.01)
  *H01L 21/687*   (2006.01)

(52) U.S. Cl.
  CPC .. *H01L 21/67167* (2013.01); *H01L 21/67253* (2013.01); *H01L 21/67265* (2013.01); *H01L 21/67754* (2013.01); *H01L 21/68764* (2013.01); *H01L 21/68771* (2013.01); *H01L 22/20* (2013.01)

(56)   References Cited

FOREIGN PATENT DOCUMENTS

| | | | |
|---|---|---|---|
| JP | 07-045524 A | | 2/1995 |
| JP | 2001-250780 A | | 9/2001 |
| JP | 2004-259933 A | | 9/2004 |
| JP | 2004259933 A | * | 9/2004 |
| JP | 2011-222825 A | | 11/2011 |
| JP | 2012049992 A | * | 3/2012 |

OTHER PUBLICATIONS

Korean Notice of Preliminary Rejection, KR Application No. 10-2014-7025008, Jan. 8, 2016, 10 pages.
Japanese Notification of Reasons of Refusal, JP Application No. 2014-503788, Oct. 20, 2016, 3 pages (English translation provided).

* cited by examiner

SUBSTRATE PROCESSING APPARATUS, SEMICONDUCTOR DEVICE MANUFACTURING METHOD, SUBSTRATE PROCESSING METHOD, AND RECORDING MEDIUM

CROSS-REFERENCE TO RELATED APPLICATION

This application is a Continuation Application of PCT International Application No. PCT/JP2013/055126, filed Feb. 27, 2013, which claimed the benefit of priority from Japanese Patent Application No. 2012-049992 filed on Mar. 7, 2012, the entire disclosures of which are incorporated herein by reference.

TECHNICAL FIELD

The present disclosure relates to a substrate processing apparatus, a semiconductor device manufacturing method, a substrate processing method, and a recording medium.

BACKGROUND

In the related art, a substrate processing step for forming a thin film on a substrate has been performed as a step of a manufacturing process of a semiconductor device, e.g., a DRAM. The substrate processing step is performed by a substrate processing apparatus that includes a cassette mounting unit configured to mount a process substrate cassette for accommodating a plurality of process substrates therein and a dummy substrate cassette for accommodating a plurality of dummy substrates therein, a process chamber in which at least one of the process substrate or the dummy substrate is processed, a gas supply unit configured to supply a process gas into the process chamber, an exhaust unit configured to exhaust an inside of the process chamber, and a transfer unit configured to transfer the substrates between the cassette mounting unit and the process chamber.

In this case, a dummy substrate may be repeatedly reused in a subsequent substrate processing. That is, for example, when the substrate processing involving a film forming process is performed, residues are generated during the film forming process and form a deposited film. Each time the dummy substrate is reused, the deposited film is accumulated on the dummy substrate. Accordingly, in order to prevent film separation caused by an increase of a cumulative thickness of the deposited film or to prevent warp or deformation of the dummy substrate caused by a stress of the deposited film, the dummy substrate is replaced once the dummy substrate is used more than a predetermined number of use (e.g., use frequency) or if the thickness of the deposited film becomes greater than a predetermined value (e.g., cumulative thickness value). In a manufacturing line of a factory, if a cumulative thickness of a deposited film of at least one of dummy substrates accommodated in a dummy substrate cassette exceeds a predetermined cumulative thickness value, the entire dummy substrate cassette is replaced (e.g., all dummy substrates are either discarded or reused). Thus, it is advisable that the dummy substrates are used in such a way that each dummy substrate has the similar use frequency or the cumulative thickness. Accordingly, for example, the dummy substrates are selected and used based on the cumulative thickness value of the dummy substrates or the like so as to effectively use the whole dummy substrates accommodated in the dummy substrate cassette.

Sometimes, a management error may occur, e.g., an error of not timely replacing a dummy substrate cassette when the dummy substrate cassette needs to be replaced because a predetermined number of dummy substrates have a thickness greater than a predetermined cumulative thickness value. Due to the management error, the substrate processing may continuously be performed using the dummy substrates whose thickness exceeds a predetermined cumulative thickness value. In such a case, a film separation may be caused by an increase of a cumulative thickness value, and particles may be generated within a process chamber, thereby deteriorating a substrate processing quality.

Therefore, it is an objective of the present disclosure to provide a substrate processing apparatus, a semiconductor device manufacturing method and a substrate processing method, which can prevent the generation of particles and improve the quality of the substrate processing.

SUMMARY

According to one embodiment of the present disclosure, there is provided a substrate processing apparatus, including: a cassette mounting unit on which a process substrate cassette and a dummy substrate cassette are mounted, the process substrate cassette being configured to accommodate a plurality of process substrates, and the dummy substrate cassette being configured to accommodate a plurality of dummy substrates; a process chamber configured to process the process substrates and the dummy substrates; a substrate support unit installed within the process chamber and provided with a plurality of substrate mounting portions arranged on the same plane of the substrate support unit, the substrate mounting portions including substrate mounting surfaces on which the process substrates and the dummy substrates are mounted; a gas supply unit configured to supply a process gas into the process chamber; an exhaust unit configured to evacuate an inside of the process chamber; a transfer unit configured to transfer the process substrates and the dummy substrates between the cassette mounting unit and the process chamber; and a control unit configured to control substrate processing performed within the process chamber and transfer processing of the process substrates and the dummy substrates performed by the transfer unit. The control unit includes a calculation unit configured to calculate a cumulative film thickness value for each of the dummy substrates, and is configured to execute at least one of a control of the transfer processing performed by the transfer unit and a determination whether or not to perform the substrate processing within the process chamber based on the cumulative film thickness value calculated by the calculation unit.

According to another aspect of the present disclosure, there is provided a semiconductor device manufacturing method, including: mounting, on a cassette mounting unit, a process substrate cassette, into which a plurality of process substrates is accommodated, and a dummy substrate cassette, into which a plurality of dummy substrates is accommodated; detecting a number of unprocessed process substrates among the process substrates accommodated in the process substrate cassette and determining a number of dummy substrates to be carried into the process chamber; selecting the number of dummy substrates to be carried from the dummy substrate cassette into the process chamber based on a cumulative film thickness value for each of the plurality of dummy substrates calculated by a calculation unit; transferring the process substrates and the number of dummy substrates into the process chamber using a transfer unit, and mounting the process substrates and the number of dummy substrates transferred into the process chamber on all substrate mounting surfaces of a plurality of substrate mounting portions, the plurality of substrate mounting portions being arranged on the same plane of a surface of a substrate support unit which is installed within the process chamber; and supplying a process gas into the process chamber using a gas supply unit so as to process the process substrates and the number of dummy substrates.

According to a further aspect of the present disclosure, there is provided a substrate processing method, including: mounting, on a cassette mounting unit, a process substrate cassette, into which a plurality of process substrates is accommodated, and a dummy substrate cassette, into which a plurality of dummy substrates is accommodated; detecting a number of unprocessed process substrates among the process substrates accommodated in the process substrate cassette and determining a number of dummy substrates to be carried into the process chamber; selecting the number of dummy substrates to be carried from the dummy substrate cassette into the process chamber based on a cumulative film thickness value for each of the plurality of dummy substrates calculated by a calculation unit; transferring the process substrates and the number of dummy substrates into the process chamber using a transfer unit, and mounting the process substrates and the number of dummy substrates transferred into the process chamber on all substrate mounting surfaces of a plurality of substrate mounting portions, the plurality of substrate mounting portions being arranged on the same plane of a surface of a substrate support unit which is installed within the process chamber; and supplying a process gas into the process chamber by a gas supply unit so as to process the process substrates and the number of dummy substrates.

According to the substrate processing apparatus, the semiconductor device manufacturing method, the substrate processing method and a recording medium of the present disclosure, it is possible to prevent the particles from being generated and to improve the quality of the substrate processing.

DETAILED DESCRIPTION

Figure 1:
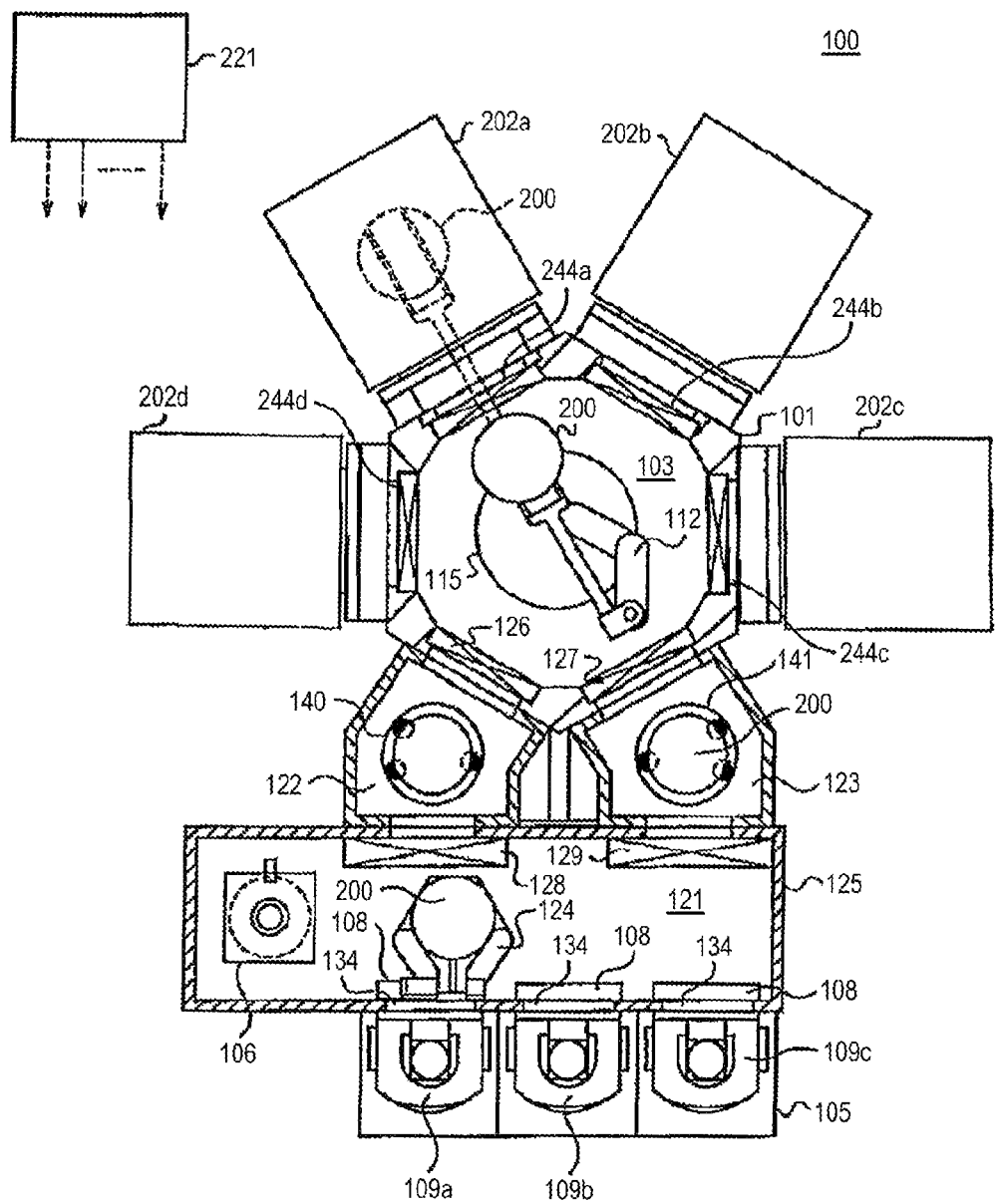
FIG. 1 is a schematic horizontal sectional view of a cluster type substrate processing apparatus according to one embodiment of the present disclosure.

Embodiments of the present disclosure will now be in detail described in detail with reference to the accompanying drawings.

(1) Configuration of Substrate Processing Apparatus 1 is a horizontal sectional view of a cluster type substrate processing apparatus according to the present embodiment. A transfer device of the cluster type substrate processing apparatus according to the present embodiment is divided into a vacuum side and an atmosphere side. The term "vacuum" used herein means the industrial vacuum.

(Vacuum Side Configuration)

The cluster type substrate processing apparatus 100 includes a vacuum transfer chamber 103 as a first transfer chamber which is configured in a load lock chamber structure capable of depressurizing an interior thereof to a pressure of less than an atmospheric pressure (e.g., 100 Pa) such as a vacuum state. A housing 101 of the vacuum transfer chamber 103 has, e.g., a hexagonal shape when seen in a plan view. The housing 101 is formed into a box shape with upper and lower end portions closed.

On two front sidewalls among six sidewalls that constitute the housing 101 of the vacuum transfer chamber 103, load lock chambers 122 and 123 are respectively installed so as to communicate with the vacuum transfer chamber 103 through gate valves 126 and 127.

On the remaining four sidewalls of the vacuum transfer chamber 103, process chambers 202a, 202b, 202c and 202d as process chambers according to the present embodiment are respectively installed so as to communicate with the vacuum transfer chamber 103 through gate valves 244a, 244b, 244c and 244d. A gas supply unit 250, an exhaust unit, and so forth, which will be described later, are installed in the process chambers 202a to 202d. As will be described later, the process chambers 202a to 202d are configured such that the number of a plurality of process regions are equal to the number of a plurality of purge regions, and the plurality of process regions and the plurality of purge regions are alternately arranged within one reaction vessel 203. By rotating a susceptor 217 as a substrate support unit, at least one of the wafers 200 among process wafers as process substrates and dummy wafers as dummy substrates is alternately passed through the process regions and the purge regions. Various kinds of substrate processing processes such as a process of forming a thin film on the wafer 200 and a process of oxidizing, nitriding or carbonizing a surface of the wafer 200 are implemented by alternately supplying a process gas and an inert gas onto the wafer 200.

A vacuum transfer robot 112 as a first transfer mechanism is installed within the vacuum transfer chamber 103. The vacuum transfer robot 112 is configured to transfer the wafer 200 (indicated by a dot line in 1) between the load lock chambers 122 and 123 and the process chambers 202a to 202d. As will be described later, in the present embodiment, a process wafer and a dummy wafer are used as the wafer 200. The vacuum transfer robot 112 can be moved up and down by an elevator 115 while maintaining air-tightness of the vacuum transfer chamber 103. Wafer existence/absence sensors (not shown) as substrate detecting units for detecting the existence and the absence of the process wafer 200 or the dummy wafer 200 are installed near the gate valves 126 and 127 of the load lock chambers 122 and 123 and near the gate valves 244a to 244d of the process chambers 202a to 202d.

The load lock chambers 122 and 123 are configured in a load lock chamber structure capable of depressurizing the inside thereof to a pressure of less than an atmospheric pressure (a reduced pressure) such as a vacuum state. That is to say, an atmosphere transfer chamber 121 as a second transfer chamber to be described later is installed at the front sides of the load lock chambers 122 and 123 via gate valves 128 and 129. Thus, if the insides of the load lock chambers 122 and 123 are evacuated by closing the gate valves 126 to 129 and then if the gate valves 126 and 127 are opened, the process wafer 200 and the dummy wafer 200 can be transferred between the load lock chambers 122 and 123 and the vacuum transfer chamber 103 while keeping the vacuum transfer chamber 103 in a vacuum state. Furthermore, the load lock chambers 122 and 123 serve as preparatory chambers that temporarily accommodate the process wafer 200 and the dummy wafer 200 to be carried into the vacuum transfer chamber 103. At this time, the wafer 200 (the process wafer or the dummy wafer) is mounted on a substrate mounting part 140 within the load lock chamber 122 and is mounted on a substrate mounting part 141 within the load lock chamber 123.

(Atmosphere Side Configuration)

The atmosphere transfer chamber 121 as the second transfer chamber to be used under a substantially atmospheric pressure is installed at an atmosphere side of the substrate processing apparatus 100. That is to say, the atmosphere transfer chamber 121 is installed at the front sides of the load lock chambers 122 and 123 via the gate valves 128 and 129. The atmosphere transfer chamber 121 is installed so as to communicate with the load lock chambers 122 and 123.

An atmosphere transfer robot 124 as a second transfer mechanism for transferring the process wafer 200 and the dummy wafer 200 is installed in the atmosphere transfer chamber 121. The atmosphere transfer robot 124 is moved up and down by an elevator (not shown) installed in the atmosphere transfer chamber 121 and is reciprocated in a horizontal direction (e.g., left-right direction) by a linear actuator (not shown). Wafer existence/absence sensors (not shown) as substrate detecting units for detecting the existence and the absence of the process wafer 200 or the dummy wafer 200 are installed near the gate valves 128 and 129 of the atmosphere transfer chamber 121.

As a correction device for correcting the position of at least the process wafer 200, a notch aligning device 106 for aligning a crystal direction or a position of the process wafer 200 by using a notch of the process wafer 200 is installed within the atmosphere transfer chamber 121. In place of the notch aligning device 106, there may be installed an orientation flat aligning device (not shown). A clean unit (not shown) for supplying clean air is installed in an upper portion of the atmosphere transfer chamber 121.

Substrate transfer gates 134 through which the process wafer 200 and the dummy wafer 200 are transferred into and out of the atmosphere transfer chamber 121, and cassette openers 108, are installed at a front side of a housing 125 of the atmosphere transfer chamber 121. A load port (an I/O stage) 105 as a cassette mounting stand (a cassette mounting unit) is installed at an opposite side of the substrate transfer gates 134 from the cassette openers 108, namely at an outer side of the housing 125. Cassettes 109a, 109b, and 109c for accommodating a plurality of wafers 200 are mounted on the load port 105. That is to say, in the present embodiment, process substrate cassettes 109a and 109b for accommodating a plurality of process wafers 200 therein and a dummy substrate cassette 109c for accommodating a plurality of dummy wafers 200 therein are mounted on the load port 105. In addition, lids (not shown) for opening and closing the substrate transfer gates 134, opening/closing mechanisms (not shown) for opening and closing caps of the cassettes 109a, 109b, and 109c, and opening/closing mechanism drive units (not shown) for driving the opening/closing mechanisms are installed within the atmosphere transfer chamber 121. The cassette openers 108 open and close the caps of the cassettes 109a, 109b, and 109c mounted on the load port 105, so that the process wafers 200 or the dummy wafers 200 can be taken out from or placed into the cassettes 109a, 109b, and 109c. Moreover, the cassettes 109a, 109b, and 109c are carried (supplied) into or carried (discharged) out of the load port 105 by a transfer device (RGV).

A transfer unit of the substrate processing apparatus 100 according to the present embodiment, which transfers the process wafer 200 and the dummy wafer 200 between the load port 105 and the process chambers 202a to 202d, is mainly composed of the vacuum transfer chamber 103, the vacuum transfer robot 112, the load lock chambers 122 and 123, the atmosphere transfer chamber 121, the atmosphere transfer robot 124 and the gate valves 126 to 129.

A control unit 221 to be described later is electrically connected to the respective components of the transfer unit of the substrate processing apparatus 100. The control unit 221 is configured to control operations of the respective components.

(Wafer Transfer Operation)

Next, description will be made on a transfer operation of the process wafer 200 and the dummy wafer 200, namely a transfer operation of the wafer 200, which is performed within the substrate processing apparatus 100 according to the present embodiment. The operations of the respective components of the transfer unit of the substrate processing apparatus 100 are controlled by the control unit 221 to be described later.

Initially, for example, the process substrate cassette 109a into which 25 unprocessed process wafers 200 are accommodated, the process substrate cassette 109b into which 25 processed process wafers 200 are accommodated, and the dummy substrate cassette 109c into which 25 dummy wafers 200 are accommodated, are carried into the substrate processing apparatus 100 by a transfer device (not shown). The cassettes 109a to 109c are mounted on the load port 105. At this time, the dummy substrate cassette 109c remaining within the substrate processing apparatus 100 may be limited to one. The opening/closing mechanism (not shown) removes the cap of the process substrate cassette 109a or the dummy substrate cassette 109c, thereby opening the substrate transfer gate 134 and a wafer gateway of the process substrate cassette 109a or the dummy substrate cassette 109c.

If the wafer gateway of the process substrate cassette 109a or the dummy substrate cassette 109c is opened, the atmosphere transfer robot 124 installed within the atmosphere transfer chamber 121 picks up one process wafer 200 or one dummy wafer 200 from the process substrate cassette 109a or the dummy substrate cassette 109c and mounts the process wafer 200 or the dummy wafer 200 on the notch aligning device 106.

The notch aligning device 106 displaces the mounted wafer 200 (the process wafer or the dummy wafer) in horizontal lengthwise and crosswise directions (X and Y directions) and in a circumferential direction, thereby adjusting a notch position and a center position of the wafer 200. During the time when the position of a first wafer 200 carried out from the process substrate cassette 109a or the dummy substrate cassette 109c is adjusted by the notch aligning device 106, the atmosphere transfer robot 124 picks up a second process wafer 200 or a second dummy wafer 200 from the process substrate cassette 109a or the dummy substrate cassette 109c, carries same into the atmosphere transfer chamber 121, and is on standby within the atmosphere transfer chamber 121.

After the position of the first wafer 200 is adjusted by the notch aligning device 106, the atmosphere transfer robot 124 picks up the first wafer 200 from the notch aligning device 106. At this time, the atmosphere transfer robot 124 mounts the second wafer 200 held by the atmosphere transfer robot 124 onto the notch aligning device 106. Thereafter, the notch aligning device 106 adjusts the notch position or the like of the second wafer 200 mounted thereon.

Then, the gate valve 128 is opened. The atmosphere transfer robot 124 carries the first wafer 200 into the load lock chamber 122 and mounts the first wafer 200 on the substrate mounting part 140. During the transfer operation, the gate valve 126 existing at the side of the vacuum transfer chamber 103 is closed and the inside of the vacuum transfer chamber 103 is kept in a depressurized atmosphere. If the transfer of the first wafer 200 onto the substrate mounting part 140 is finished, the gate valve 128 is closed and the inside of the load lock chamber 122 is evacuated into a negative pressure by an exhaust device (not shown).

Thereafter, the atmosphere transfer robot 124 repeatedly performs the operations described above. In case where the load lock chamber 122 is kept in a negative pressure state, the atmosphere transfer robot 124 does not carry the process wafer 200 or the dummy wafer 200 into the load lock chamber 122 but stops and waits at a position just ahead of the load lock chamber 122.

If the inside of the load lock chamber 122 is depressurized to a predetermined pressure value (e.g., 100 Pa), the gate valve 126 is opened such that the load lock chamber 122 and the vacuum transfer chamber 103 communicate with each other. Subsequently, the vacuum transfer robot 112 arranged within the vacuum transfer chamber 103 picks up the first wafer 200 from the substrate mounting part 140 and carries the first wafer 200 into the vacuum transfer chamber 103.

After the vacuum transfer robot 112 picks up the first wafer 200 from the substrate mounting part 140, the gate valve 126 is closed and the inside of the load lock chamber 122 is returned to an atmospheric pressure. A preparatory process for carrying the next wafer 200 (the second process wafer or the second dummy wafer) into the load lock chamber 122 is carried out. Concurrently, the gate valve 244a of the process chamber 202a kept at a specified pressure (e.g., 100 Pa) is opened. The vacuum transfer robot 112 carries the first wafer 200 into the process chamber 202a. This operation is repeated until an arbitrary number of (e.g., five) wafers 200 (process wafers or dummy wafers) are carried into the process chamber 202a. If an arbitrary number of (e.g., five) wafers 200 are carried into the process chamber 202a, the gate valve 244a is closed. Then, a process gas is supplied from a below-described gas supply unit 250 into the process chamber 202a, whereby the specified processing is performed with respect to the wafers 200.

If the specified processing is finished in the process chamber 202a, the gate valve 244a is opened and the wafers 200 are carried out from the process chamber 202a into the vacuum transfer chamber 103 by the vacuum transfer robot 112. Thereafter, the gate valve 244a is closed.

Subsequently, the gate valve 127 is opened. Each wafer 200 carried out from the process chamber 202a is carried into the load lock chamber 123 and is mounted on the substrate mounting part 141. The load lock chamber 123 is depressurized to a predetermined pressure value by an exhaust device (not shown). Then, the gate valve 127 is closed. An inert gas is introduced from an inert gas supply unit (not shown) connected to the load lock chamber 123. The internal pressure of the load lock chamber 123 is returned to an atmospheric pressure.

If the internal pressure of the load lock chamber 123 is returned to an atmospheric pressure, the gate valve 129 is opened. Subsequently, the atmosphere transfer robot 124 picks up the processed wafer 200 from the substrate mounting part 141 and carries the processed wafer 200 into the atmosphere transfer chamber 121. Then, the gate valve 129 is closed. Thereafter, the atmosphere transfer robot 124 brings the processed process wafer 200 into, e.g., the process substrate cassette 109b which may be empty through the substrate transfer gate 134 of the atmosphere transfer chamber 121 and brings the dummy wafer 200 into the dummy substrate cassette 109c. At this time, the cap of the process substrate cassette 109b may be continuously opened until up to 25 wafers 200 are returned to the process substrate cassette 109b. Alternatively, the processed wafer 200 may not be placed into the empty process substrate cassette 109b but may be returned to the original process substrate cassette 109a from which the wafer 200 is taken out.

If all the unprocessed process wafers 200 existing within the process substrate cassette 109a are subjected to the specified processing through the aforementioned process and if all the processed process wafer 200 are accommodated in a specified cassette 109b, the caps of the cassettes 109a to 109c and the lids of the substrate transfer gates 134 are closed by the opening/closing mechanisms (not shown). Thereafter, the process substrate cassettes 109a and 109b are transferred from the load port 105 to the next station by a transfer device (not shown). By repeating the aforementioned operations, each of 25 process wafers 200 is processed one after another.

(2) Configuration of Process Chamber

Next, a configuration of the process chamber 202a as a process chamber according to the present embodiment will be described primarily with reference to FIGS. 2 to 5. 2 is a schematic perspective view of a reaction vessel employed in the process chamber according to the present embodiment. 3 is a schematic vertical sectional view of the process chamber according to the present embodiment. 4 is a schematic horizontal sectional view of the process chamber according to the present embodiment. 5 is a schematic configuration diagram of a controller of the substrate processing apparatus used in the present embodiment. The process chambers 202b to 202d may have the same configuration as the process chamber 202a and, therefore, will not be described here.

(Reaction Vessel)

Figure 2:
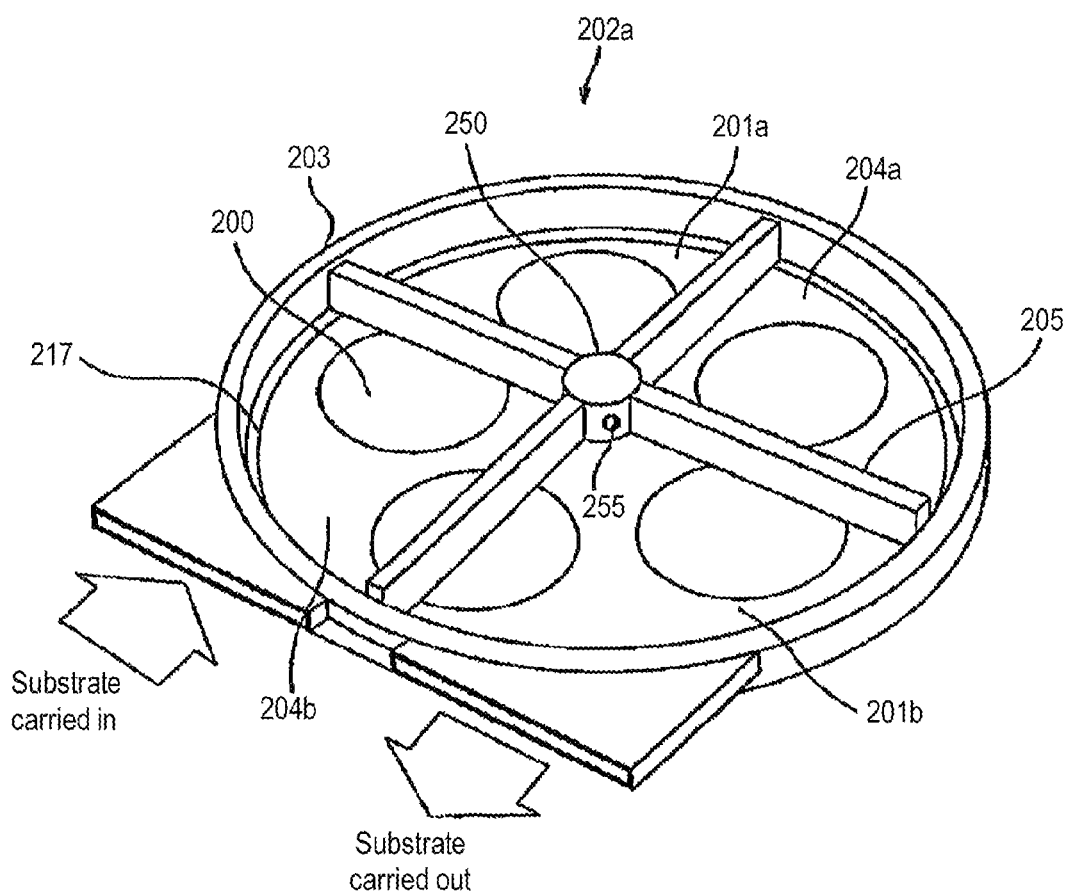
FIG. 2 is a schematic perspective view of a reaction vessel employed in a process chamber according to one embodiment of the present disclosure.
Figure 3:
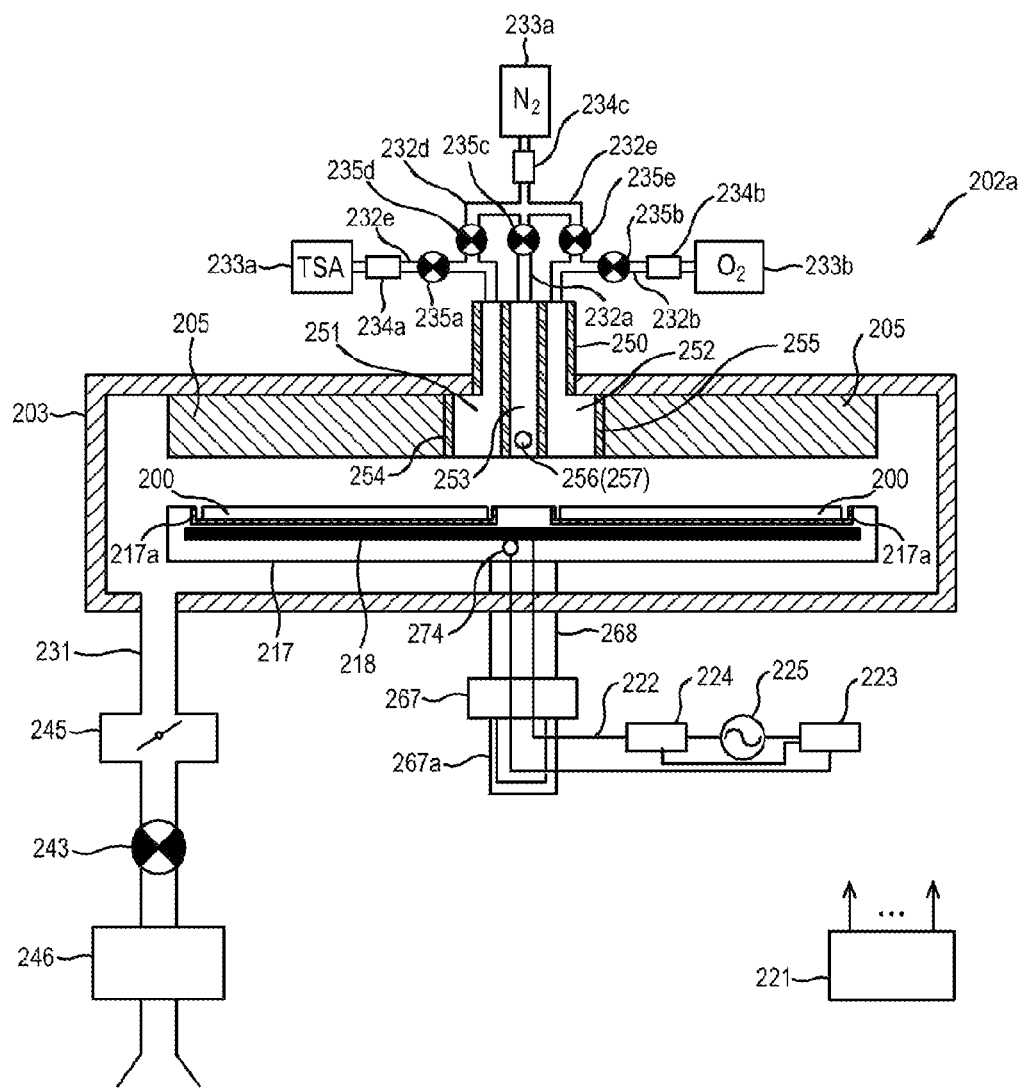
FIG. 3 is a schematic vertical sectional view of the process chamber according to one embodiment of the present disclosure.
Figure 4:
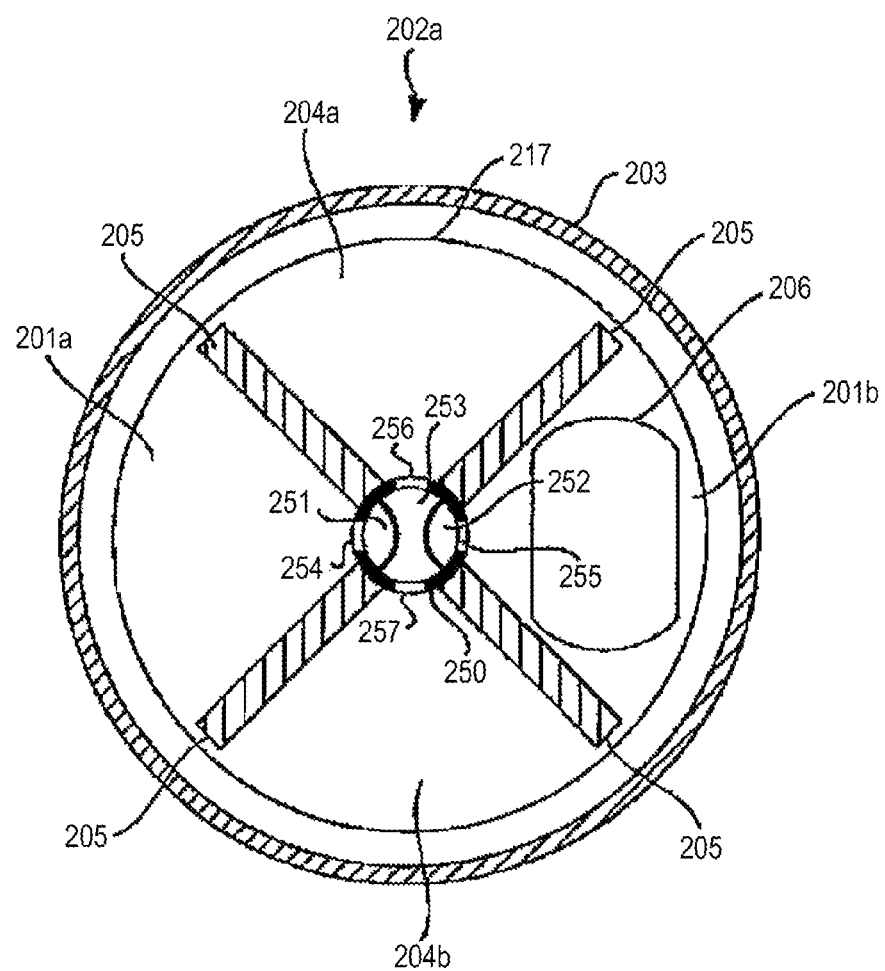
FIG. 4 is a schematic horizontal sectional view of the process chamber according to one embodiment of the present disclosure.
Figure 5:
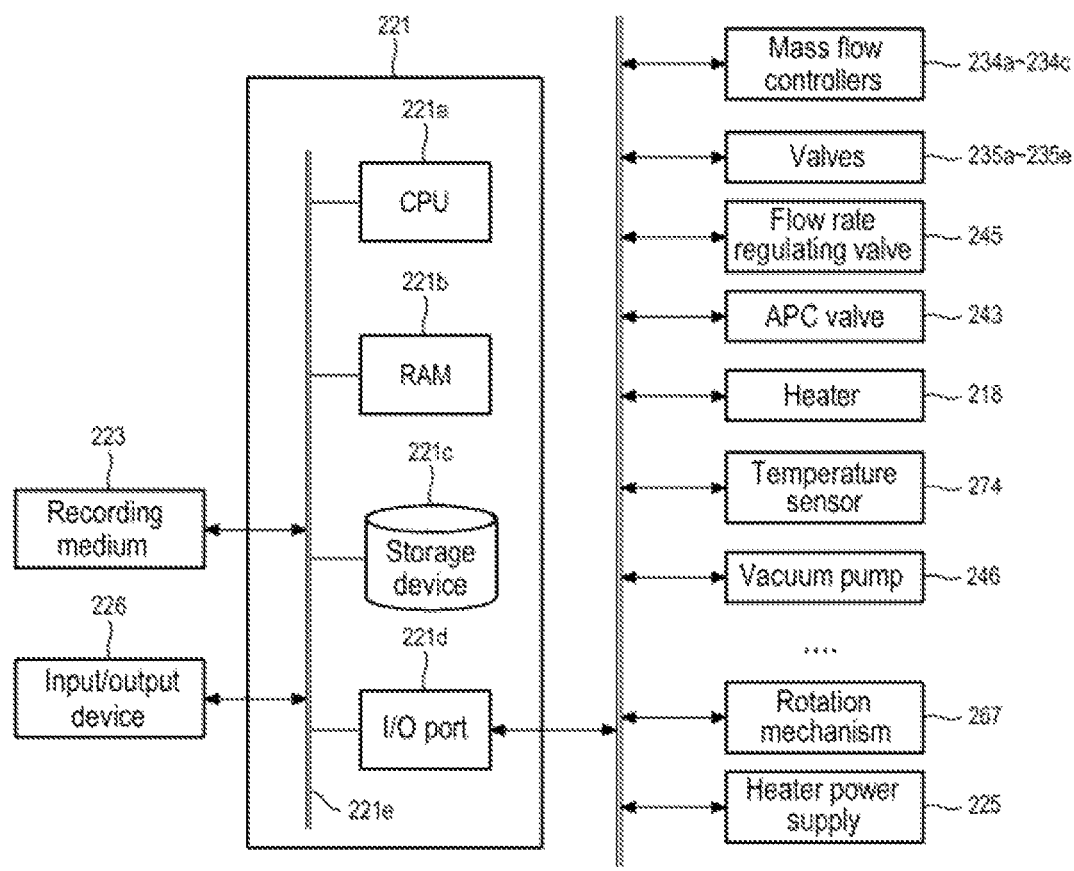
FIG. 5 is a schematic configuration diagram of a controller of the substrate processing apparatus used in the embodiment of the present disclosure.

As shown in FIGS. 2 to 4, the process chamber 202a as a process chamber according to the present embodiment includes a reaction vessel 203 which is a cylindrical hermetic container. Within the reaction vessel 203, there is formed a process space in which at least one wafer 200 of the process wafers and the dummy wafers is processed. Four partition plates 205 radially extending from a central portion are installed at an upper side of the process space, namely at a ceiling side, within the reaction vessel 203. The four partition plates 205 are configured to divide the process space of the reaction vessel 203 into a first process region 201a, a first purge region 204a, a second process region 201b and a second purge region 204b. The first process region 201a, the first purge region 204a, the second process region 201b and the second purge region 204b are arranged in the named order along a rotation direction of the susceptor 217 to be described later.

As will be described later, upon rotating the susceptor 217, the wafers 200 mounted on a plurality of mounting portions 217a arranged on a circumference on an upper surface of the susceptor 217 are moved through the first process region 201a, the first purge region 204a, the second process region 201b and the second purge region 204b in the named order. As set forth below, a first process gas is supplied into the first process region 201a. A second process gas is supplied into the second process region 201b. An inert gas is supplied into the first purge region 204a and the second purge region 204b. Thus, as the susceptor 217 rotates, the first process gas, the inert gas, the second process gas and the inert gas are alternately supplied on the wafers 200 in the named order, whereby a desired film is formed. However, the desired film may extend to the mounting portions 217a of the susceptor 217. The configurations of the susceptor 217 and the gas supply unit 250 will be described later.

A clearance having a specified width is defined between an end portion of each of the partition plates 205 and a sidewall of the reaction vessel 203 such that a gas can pass through the clearance. An inert gas is injected from the first purge region 204a and the second purge region 204b or the aforementioned clearance into the first process region 201a and the second process region 201b. This makes it possible to suppress an infiltration of a process gas into the first purge region 204a and the second purge region 204b, thereby suppressing reaction of the process gas (resultant generation of foreign substances).

In the present embodiment, an angle between the respective partition plates 205 is set equal to 90 degrees. However, the present disclosure is not limited thereto. That is to say, in view of a supply time of various kinds of gases supplied to the wafers 200, the angle between two partition plates 205 that define the second process region 201b may be increased or may be properly adjusted.

(Susceptor)

As shown in FIGS. 2 to 4, the rotatable susceptor 217 as a substrate support unit having a rotation axis concentric with the center of the reaction vessel 203 is installed below the partition plates 205, namely in the bottom center region within the reaction vessel 203. The susceptor 217 is made of, e.g., a nonmetallic material such as aluminum nitride (AlN), ceramics or quartz, so as to prevent the wafers 200 from being contaminated. Moreover, the susceptor 217 is electrically insulated from the reaction vessel 203.

The susceptor 217 is configured to, within the reaction vessel 203, support a plurality of (e.g., five, in the present embodiment) wafers 200 arranged on the same plane and on the same circumference. In this regard, the same plane is not limited to perfectly the same surface. It is only necessary that, when the susceptor 217 is viewed from above, as shown in 2, a plurality of wafers 200 is arranged so as not to overlap with one another.

As shown in 3, the mounting portions (substrate mounting portions) 217a as circular recess portions are installed in support positions of the wafers 200 on the surface of the susceptor 217. The mounting portions 217a are a little larger in diameter than the wafers 200. Substrate mounting surfaces that are bottoms of the mounting portions 217a have a planar shape. By mounting the wafers 200 on the substrate mounting surfaces, it is possible to easily perform the positioning of the wafers 200. Since the substrate mounting surfaces are larger in diameter than the wafers 200, the wafers 200 are slid along the substrate mounting surfaces toward the outer periphery of the susceptor 217 by a centrifugal force exerted on the wafers 200 when the susceptor 217 starts to rotate. In this case, the sliding wafers 200 come into contact with side surfaces of the mounting portions 217a. It is therefore possible to prevent the wafers 200 from jumping out of the mounting portions 217a.

When mounting the wafers 200 on the susceptor 217, the number of unprocessed process wafers 200 accommodated in the process substrate cassette 109a is detected and the number of dummy wafers 200 to be carried into the process chamber 202a is determined.

As described later, the dummy wafers 200 are mounted for the purpose of preventing the formation of films on, e.g., the substrate mounting surfaces of the mounting portions 217a.

As shown in 3, an elevator mechanism 268 for moving the susceptor 217 up and down is installed in the susceptor 217. A plurality of through-holes is formed in the susceptor 217. A plurality of wafer pushup pins for pushing up the wafers 200 and supporting rear surfaces of the wafers 200 when the wafers 200 are carried into or out of the reaction vessel 203 is installed on a bottom surface of the reaction vessel 203. The through-holes and the wafer pushup pins are arranged such that, when the wafer pushup pins are moved up or when the susceptor 217 is moved down by the elevator mechanism 268, the wafer pushup pins pass through the through-holes without making contact with the susceptor 217.

A rotation mechanism 267 for rotating the susceptor 217 is installed in the elevator mechanism 268. The rotation mechanism 267 includes a rotation shaft (not shown) connected to the susceptor 217. The susceptor 217 can be rotated by operating the rotation mechanism 267. A control unit 221 to be described later is connected to the rotation mechanism 267 via a coupling portion 267a. The coupling portion 267a is composed a slip ring mechanism that electrically interconnects a rotating member and a fixed member with a metal brush or the like. This does not hinder the rotation of the susceptor 217. The control unit 221 is configured to control the electric power supplied to the rotation mechanism 267, so that the susceptor 217 can be rotated at a specified speed for a specified time. As described above, upon rotating the susceptor 217, the wafers 200 mounted on the susceptor 217 are moved through the first process region 201a, the first purge region 204a, the second process region 201b and the second purge region 204b in the named order.

(Heating Unit)

A heater 218 as a heating unit is integrally embedded within the susceptor 217 so that the heater 218 can heat the wafers 200. If the electric power is supplied to the heater 218, the surfaces of the wafers 200 are heated to a specified temperature (e.g., from a room temperature to about 1,000 degree C.). A plurality of (e.g., five) heaters 218 may be installed on the same plane so as to individually heat the respective wafers 200 mounted on the susceptor 217.

A temperature sensor 274 is installed in the susceptor 217. A temperature regulator 223, a power controller 224 and a heater power supply 225 are electrically connected to the heater 218 and the temperature sensor 274 through a power supply line 222. The electric power supplied to the heater 218 is controlled based on temperature information detected by the temperature sensor 274.

(Gas Supply Unit)

As shown in FIGS. 3 and 4, a gas supply unit 250 that includes a first process gas introduction portion 251, a second process gas introduction portion 252, an inert gas introduction portion 253, and a process gas supply system and an inert gas supply system for supplying gases to the respective gas introduction portions is installed at an upper side of the reaction vessel 203. The gas supply unit 250 is air-tightly installed in an opening formed in an upper portion of the reaction vessel 203. A first gas spray nozzle 254 is installed in a sidewall of the first process gas introduction portion 251. A second gas spray nozzle 255 is installed in a sidewall of the second process gas introduction portion 252. A first inert gas spray nozzle 256 and a second inert gas spray nozzle 257 are installed in sidewalls of the inert gas introduction portion 253 in an opposing relationship with each other. The gas supply unit 250 is configured such that a first process gas is supplied from the first process gas introduction portion 251 into the first process region 201a, a second process gas is supplied from the second process gas introduction portion 252 into the second process region 201b and an inert gas is supplied from the inert gas introduction portion 253 into the first purge region 204a and the second purge region 204b. The gas supply unit 250 is configured so as to independently supply the respective process gases and the inert gas without mixing them with each other and so as to simultaneously supply the respective process gases and the inert gas.

(Process Gas Supply System)

A first gas supply pipe 232a is connected to an upstream side of the first process gas introduction portion 251. A precursor gas supply source 233a, a mass flow controller (MFC) 234a as a flow rate controller (flow rate control unit), and a valve 235a as an on-off valve are installed at the upstream side of the first gas supply pipe 232a in the named order from the upstream side.

A first process gas, e.g., a silicon-containing gas, is supplied from the first gas supply pipe 232a into the first process region 201a via the mass flow controller 234a, the valve 235a, the first process gas introduction portion 251 and the first gas spray nozzle 254. As the silicon-containing gas, it is possible to use, e.g., trisilylamine ($SiH_3)_3N$, abbreviation: TSA) gas. The first process gas may be any one of a solid, a liquid or a gas at a normal temperature and a normal pressure. In the following description, the first process gas will be regarded as a gas. If the first process gas is a liquid at a normal temperature and a normal pressure, a vaporizer (not shown) may be installed between the precursor gas supply source 233a and the mass flow controller 234a.

A second gas supply pipe 232b is connected to an upstream side of the second process gas introduction portion 252. A precursor gas supply source 233b, a mass flow controller (MFC) 234b as a flow rate controller (flow rate control unit), and a valve 235b as an on-off valve are installed at the upstream side of the second gas supply pipe 232b in the named order from the upstream side.

A second process gas, e.g., an oxygen ($O_2$) gas as an oxygen-containing gas, is supplied from the second gas supply pipe 232b into the second process region 201b via the mass flow controller 234b, the valve 235b, the second process gas introduction portion 252 and the second gas spray nozzle 255. The oxygen gas as the second process gas is converted to a plasma state by a plasma generating unit 206 and is supplied to the wafers 200. The oxygen gas as the second process gas may be thermally activated by regulating the temperature of the heater 218 and the internal pressure of the reaction vessel 203 to fall within specified ranges. An ozone ($O_3$) gas or water vapor ($H_2O$) may be used as the oxygen-containing gas.

A first process gas supply system is mainly composed of the first gas supply pipe 232a, the precursor gas supply source 233a, the mass flow controller 234a and the valve 235a. The first process gas introduction portion 251 and the first gas spray nozzle 254 may be included in the first process gas supply system. A second process gas supply system is mainly composed of the second gas supply pipe 232b, the precursor gas supply source 233b, the mass flow controller 234b and the valve 235b. The second process gas introduction portion 252 and the second gas spray nozzle 255 may be included in the second process gas supply system. The process gas supply system is mainly composed of the first process gas supply system and the second process gas supply system.

(Inert Gas Supply System)

A first inert gas supply pipe 232c is connected to an upstream side of the inert gas introduction portion 253. An inert gas supply source 233c, a mass flow controller (MFC) 234c as a flow rate controller (flow rate control unit), and a valve 235c as an on-off valve are installed at the upstream side of the first inert gas supply pipe 232c in the named order from the upstream side.

An inert gas, e.g., a nitrogen ($N_2$) gas, is supplied from the first inert gas supply pipe 232c into the first purge region 204a and the second purge region 204b through the mass flow controller 234c, the valve 235c, the inert gas introduction portion 253, the first inert gas spray nozzle 256 and the second inert gas spray nozzle 257. The inert gas supplied into the first purge region 204a and the second purge region 204b acts as a purge gas in a film forming step S32 to be described later. In addition to the $N_2$ gas, a rare gas such as a He gas, a Ne gas, an Ar gas, and the like can be used as the inert gas.

A downstream end portion of the second inert gas supply pipe 232d is connected to the first gas supply pipe 232a at a downstream side of the valve 235a. An upstream end portion of the second inert gas supply pipe 232d is connected to the first inert gas supply pipe 232c between the mass flow controller 234c and the valve 235c. A valve 235d as an on-off valve is installed in the second inert gas supply pipe 232d.

An inert gas, e.g., a $N_2$ gas, is supplied from the second inert gas supply pipe 232d into the first process region 201a through the mass flow controller 234c, the valve 235d, the first gas supply pipe 232a, the first process gas introduction portion 251 and the first gas spray nozzle 254. The inert gas supplied into the first process region 201a acts as a carrier gas or a diluting gas in the film forming step S32 to be described later.

A downstream end portion of a third inert gas supply pipe 232e is connected to the second gas supply pipe 232b at a downstream side of the valve 235b. An upstream end portion of the third inert gas supply pipe 232e is connected to the first inert gas supply pipe 232c between the mass flow controller 234c and the valve 235c. A valve 235e as an on-off valve is installed in the third inert gas supply pipe 232e.

An inert gas, e.g., a $N_2$ gas, is supplied from the third inert gas supply pipe 232e into the second process region 201b through the mass flow controller 234c, the valve 235e, the second gas supply pipe 232b, the second process gas introduction portion 252 and the second gas spray nozzle 255. Just like the inert gas supplied into the first process region 201a, the inert gas supplied into the second process region 201b acts as a carrier gas or a diluting gas in the film forming step S32 to be described later.

A first inert gas supply system is mainly composed of the first inert gas supply pipe 232c, the inert gas supply source 233c, the mass flow controller 234c and the valve 235c. The inert gas introduction portion 253, the first inert gas spray nozzle 256 and the second inert gas spray nozzle 257 may be included in the first inert gas supply system. A second inert gas supply system is mainly composed of the second inert gas supply pipe 232d and the valve 235d. The inert gas supply source 233c, the mass flow controller 234c, the first gas supply pipe 232a, the first process gas introduction portion 251 and the first gas spray nozzle 254 may be included in the second inert gas supply system. A third inert gas supply system is mainly composed of the third inert gas supply pipe 232e and the valve 235e. The inert gas supply source 233c, the mass flow controller 234c, the second gas supply pipe 232b, the second process gas introduction portion 252 and the second gas spray nozzle 255 may be included in the third inert gas supply system. The inert gas supply system is mainly composed of the first to third inert gas supply systems.

(Exhaust Unit)

An exhaust pipe 231 for exhausting an atmospheric gas existing within the process regions 201a and 201b and the purge regions 204a and 204b is installed in the reaction vessel 203. A vacuum pump 246 as a vacuum exhaust device is connected to the exhaust pipe 231 through a flow rate regulating valve 245 for regulating a flow rate when discharging an atmospheric gas existing within the reaction vessel 203 (the process regions 201a and 201b and the purge regions 204a and 204b) and an APC (Auto Pressure Controller) valve 243 as a pressure regulator (pressure regulating unit). The vacuum pump 246 is configured to evacuate the inside of the reaction vessel 203 such that the internal pressure of the reaction vessel 203 becomes a specified pressure (vacuum degree). The APC valve 243 is an on-off valve capable of, when opened or closed, evacuating the inside of the reaction vessel 203 or stopping the evacuation and capable of regulating the pressure through the regulation of a valve opening degree. An exhaust unit is mainly composed of the exhaust pipe 231, the APC valve 243 and the flow rate regulating valve 245.

(Control Unit)

As shown in 5, a control unit 221 as a control unit (control means) is configured as a computer that includes a central processing unit (CPU) 221a, a memory (RAM) 221b having a memory region therein, a storage device (e.g., a flash memory, a HDD or the like) 221c and an I/O port 221d. The RAM 221b, the storage device 221c and the I/O port 221d are configured to exchange data with the CPU 221a via an internal bus 221e. An input/output device 226 as an operation unit including, e.g., a touch panel, is connected to the control unit 221.

A control program for controlling operations of the substrate processing apparatus 100 or a process recipe, in which a sequence or condition for processing a substrate is written, is readably stored within the storage device 221c. The process recipe functions as a program for the control unit 221 to execute each sequence in the substrate processing process, which will be described later, to obtain a predetermined result. In the following description, the process recipe or the control program are generically referred to as a program. The RAM 221b is configured as a memory region (work area) that temporarily holds the program or data read out by the CPU 221a. By reading the program into the RAM 221b and executing the program with the CPU 221a, the control unit 221 as a computer is configured to renew a cumulative film thickness value of the dummy wafer 200 to be described later and determine whether the cumulative film thickness value of the dummy wafer 200 carried into the process chamber exceeds a specified threshold value.

A calculation unit for calculating and accumulating the cumulative film thickness value for each of the dummy wafers 200 is installed in the storage device 221c. The cumulative film thickness value indicates a cumulative thickness value of the repeatedly-used dummy wafer 200. In the present embodiment, the cumulative film thickness value is calculated depending on a predetermined film thickness rate per unit time, a process execution time and a use frequency. In other words, the cumulative film thickness value is also calculated by, e.g., multiplying a thickness of a film formed after one substrate processing is executed by a substrate processing execution frequency. Based on the cumulative film thickness value of the dummy wafer 200 calculated by the calculation unit, the transfer processing of the wafer 200 may be controlled by the aforementioned transfer unit and the determination whether or not to perform the substrate processing within the process chamber (the reaction vessel 203) may be made.

When controlling the transfer processing of the wafer 200, for example, the control unit 221 preferentially selects the dummy wafer 200 having a smallest cumulative film thickness value based on the cumulative film thickness values of the dummy wafers 200. This makes it possible to prevent the particles from being generated within the process chamber, thereby improving the substrate processing quality. In addition, the dummy wafers 200 accommodated in the dummy substrate cassette 109c can be used evenly. This makes it possible to reduce the frequency for replacing the dummy substrate cassette 109c.

A plurality of predetermined threshold values for the cumulative film thickness value set with respect to the dummy wafer 200 is pre-stored in the storage device 221c. In the present embodiment, three threshold values, namely a first threshold value, a second threshold value and a third threshold value, are pre-stored as the plurality of predetermined threshold values. Then, the control unit 221 determines whether or not to perform the substrate processing. That is to say, for example, if the cumulative film thickness value of the dummy wafer 200 carried into the process chamber (the reaction vessel 203) exceeds the first threshold value, a first warning is issued (notified) while the substrate processing is performed. If the cumulative film thickness value of the dummy wafer 200 exceeds the second threshold value, a second warning is issued without executing the substrate processing. If the cumulative film thickness value of the dummy wafer 200 exceeds the third threshold value, a third warning is issued without executing the substrate processing. In this case, for example, the first warning alerts the replacement of the dummy substrate cassette 109c. In addition, the second warning indicates that the cumulative film thickness value of the dummy wafer 200 carried into the process chamber exceeds the second threshold value and further that the substrate processing will not be executed. Furthermore, the third warning indicates that an average value of the cumulative film thickness values of a plurality of dummy wafers 200 accommodated in the dummy substrate cassette 109c exceeds the third threshold value and further that the processing of the process wafers 200 accommodated in the next process substrate cassette 109a will not be executed.

As described above, if the cumulative film thickness value of the dummy wafer 200 carried into the process chamber exceeds a predetermined threshold value, the substrate processing is not performed. This makes it possible to prevent the substrate processing from being executed through the use of the dummy wafer 200 whose cumulative film thickness value exceeds the predetermined cumulative film thickness value. Moreover, if the cumulative film thickness value of the dummy wafer 200 carried into the process chamber exceeds a predetermined threshold value, there is issued a warning indicating the predetermined threshold value. This makes it possible to prevent an occurrence of a management error, e.g., an error of not timely replacing the dummy substrate cassette 109c. Thus, it is possible to prevent the film separation caused by an increase of the cumulative film thickness value of the dummy wafer 200 and to prevent the particles from being generated within the process chamber. In addition, it becomes easy to prevent warp or deformation of the dummy wafer 200 caused by a stress of a deposited film. Accordingly, it is possible to prevent the particles from being generated within the process chamber, which may be caused by, e.g., a deformed dummy wafer 200 being rubbed with the susceptor 217 or other peripheral members.

The first warning, the second warning and the third warning may be, e.g., displayed on the input/output device 226 employed in the control unit 221 or displayed on a host device that collectively manages a plurality of controllers 221. Particularly, in case where the aforementioned warnings are displayed on the host device, the dummy substrate cassette 109c may be replaced based on an instruction to replace the dummy substrate cassette 109c received in a remote control manner.

The I/O port 221d is connected to the mass flow controllers 234a, 234b and 234c, the valves 235a, 235b, 235c, 235d and 235e, the flow rate regulating valve 245, the APC valve 243, the vacuum pump 246, the heater 218, the temperature sensor 274, the rotation mechanism 267, the elevator mechanism 268, the heater power supply 225, and so forth.

The CPU 221a is configured to read out and execute the control program from the storage device 221c and to read out the process recipe from the storage device 221c pursuant to the input of an operation command from the input/output device 226. Moreover, the CPU 221a is configured to control the flow rate regulating operations for various kinds of gases performed by the mass flow controllers 234a, 234b and 234c, the opening/closing operations of the valves 235a, 235b, 235c, 235d and 235e, the pressure regulating operations based on the APC valve 243 and the flow rate regulating valve 245, the temperature regulating operation of the heater 218 based on the temperature sensor 274, the operation of starting and stopping the vacuum pump 246, the rotation speed regulating operation of the rotation mechanism 267, the elevating operation of the elevator mechanism 268, and the operation of supplying electric power by the heater power supply 225, according to contents of the read process recipe.

The control unit 221 is not limited to being configured as a dedicated computer but may be configured as a general-purpose computer. For example, the control unit 221 according to the present embodiment can be configured by preparing a computer-readable recording medium 227 (e.g., a magnetic tape, a magnetic disk such as a flexible disk or a hard disk, an optical disk such as a CD or a DVD, a magneto-optical disk such as an MO or the like, or a semiconductor memory such as a USB memory or a memory card) which stores the aforementioned program, and installing the program on the general-purpose computer through the use of the recording medium 227. In addition, means for supplying a program on the computer is not limited to the case in which the program is supplied through the recording medium 227. For example, the program may be supplied through the use of communication means such as the Internet or a dedicated line rather than through the recording medium 227.

(3) Substrate Processing Step

Figure 6:
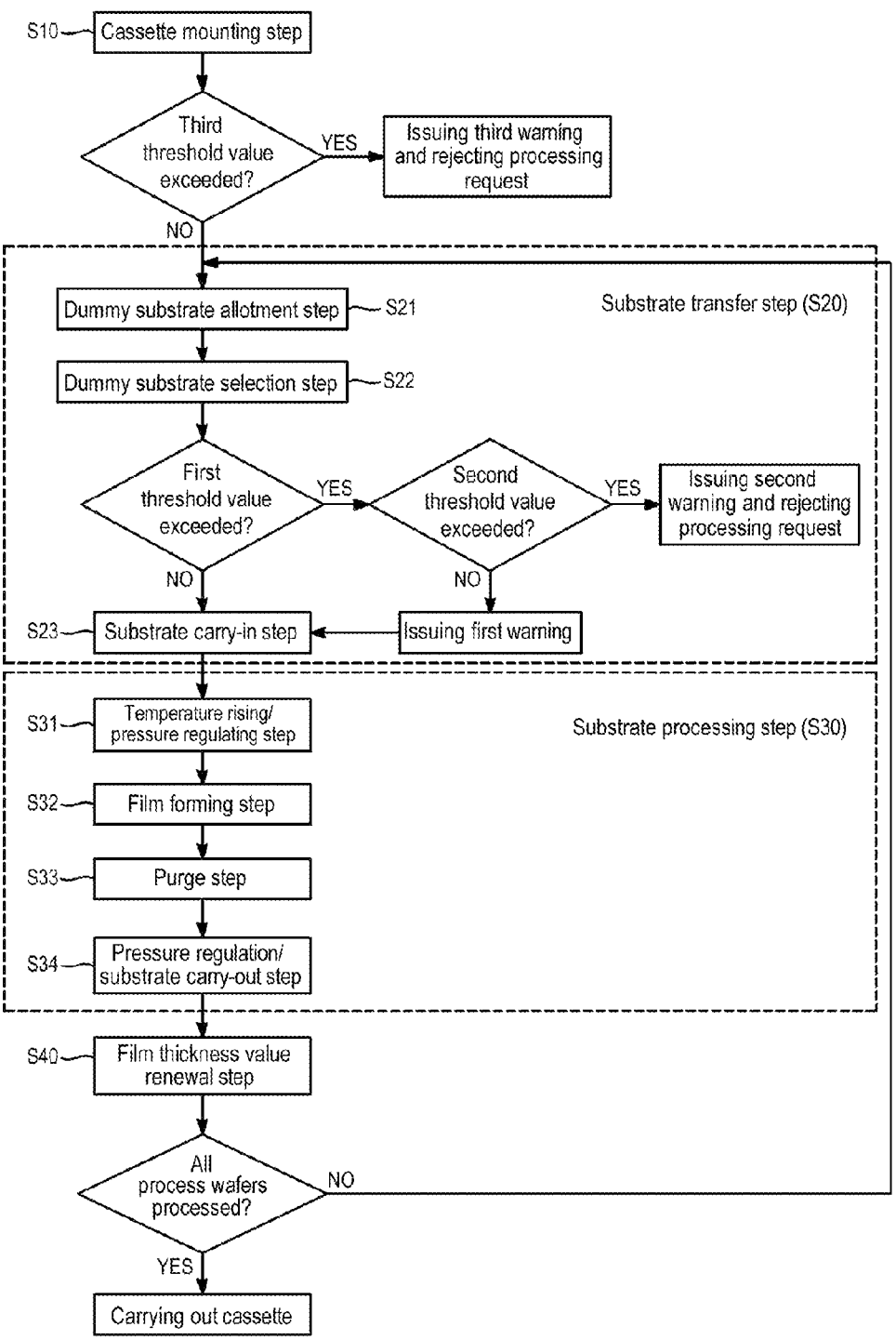
FIG. 6 is a flowchart showing a lot processing step which includes a substrate processing step according to one embodiment of the present disclosure.
Figure 7:
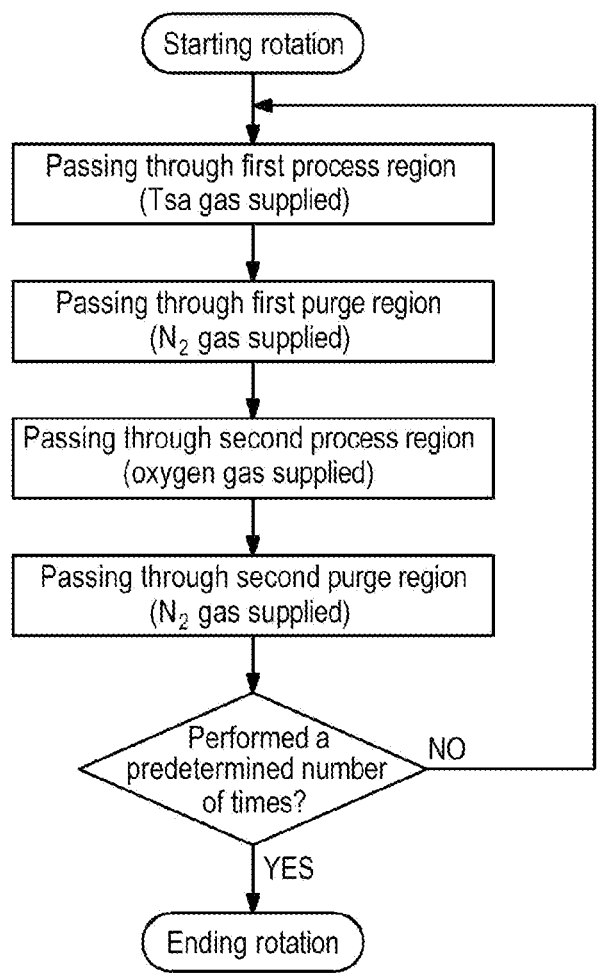
FIG. 7 is a flowchart showing substrate processing in accordance with a film forming step of the substrate processing step.

Next, as one step of a semiconductor manufacturing process according to the present embodiment, a lot processing step including a substrate processing step implemented using the process chamber 202a provided with the reaction vessel 203 will be described with reference to FIGS. 6 and 7. 6 is a flowchart showing a lot processing step which includes a substrate processing step according to the present embodiment. 7 is a flowchart showing processing of the wafer 200 as a substrate in a film forming step of the substrate processing step according to the present embodiment. In the present embodiment, the process wafers 200 and the dummy wafers 200 are managed as lots on a cassette-by-cassette basis. In the following description, operations of the respective components of the process chamber 202a of the substrate processing apparatus 100 are controlled by the control unit 221.

Description will now be made on an example in which a silicon oxide film ($SiO_2$ film) (hereinafter referred to as a SiO film) as an insulation film is formed on the wafer 200 by using trisilylamine (TSA) which is a silicon-containing gas, as a first process gas and using an oxygen gas which is an oxygen-containing gas, as a second process gas.

(Cassette Mounting Step (S10))

First, as described above, for example, the process substrate cassette 109a that accommodates unprocessed process wafers 200 therein, the process substrate cassette 109b that accommodates processed process wafers 200 therein and the dummy substrate cassette 109c that accommodates dummy wafers 200 therein are carried into the substrate processing apparatus 100 by a transfer device (not shown). The cassettes 109a to 109c carried into the substrate processing apparatus 100 are mounted on the load port 105.

(Substrate Transfer Step (S20))

In the substrate transfer step (S20), at least a dummy substrate allotment step (S21), a dummy substrate selection step (S22), a first threshold value/second threshold value based determination step and a substrate carry-in step (S23) are sequentially performed.

[Dummy Substrate Allotment Step (S21)]

Upon receiving a substrate processing request, the number of unprocessed process wafers 200 accommodated in the process substrate cassette 109a is detected and the number of dummy wafers 200 to be carried into the process chamber (the reaction vessel 203) is determined.

Consequently, for example, even if the number of unprocessed process wafers 200 is smaller than the number of wafers 200 to be processed (e.g., five) at one time, it is possible to preliminarily determine the number of dummy wafers 200 to be carried in, thereby replenishing the wafers 200 in shortage. As mentioned earlier, the dummy wafers 200 are mounted for the purpose of preventing the formation of films on, e.g., the substrate mounting surfaces which are the bottom sections of the mounting portions 217a.

It is assumed that a dummy wafer 200 is not mounted on a mounting portion where the process wafers 200 are stored. The bottom sections (the substrate mounting surfaces), on which the wafers 200 are mounted, have a planar shape. Therefore, if substrate processing is performed to form a SiO film on each of the wafers 200, a film is formed on a substrate mounting surface of a mounting portion on which the wafer 200 is not mounted. If unprocessed process wafers 200 of the next lot are mounted on the mounting portion in such a state that a film has been formed on the substrate mounting surface, the process wafer 200 is slid along the film formed on the substrate mounting surface by a centrifugal force generated when the rotation is initiated. As a result, a frictional force is generated between a rear surface of the process wafer 200 and the film formed on the substrate mounting surface. Consequently, the film formed on the substrate mounting surface of the mounting portion is separated, and thereby generating foreign substances (particles). This may adversely affect the processing of the process wafers 200.

In the present embodiment, in view of this problem, the dummy wafer 200 is mounted on the mounting portion 217a to prevent the formation of a film on the substrate mounting surface of the mounting portion 217a.

[Dummy Substrate Selection Step (S22)]

If it is determined that one or more dummy wafers 200 needs to be carried into the process chamber (the reaction vessel 203) when performing a substrate processing step (S30) to be described later, a predetermined number of dummy wafers 200 to be carried into the process chamber are selected from the dummy wafers 200 accommodated in the dummy substrate cassette 109c. At this time, the dummy wafers 200 to be carried into the process chamber are selected based on the cumulative film thickness value of the dummy wafer 200 calculated by the aforementioned calculation unit. For example, among the dummy wafers 200 accommodated in the dummy substrate cassette 109c, the dummy wafer 200 having a smallest cumulative film thickness value is preferentially selected.

[First Threshold Value/Second Threshold Value Based Determination Step]

Next, it is determined whether the cumulative film thickness value of the dummy wafer 200 selected in the dummy substrate selection step (S22) exceeds a first threshold value. If it is determined that the cumulative film thickness value of the dummy wafer 200 does not exceed the first threshold value, the substrate processing is permitted and the substrate carry-in step to be described later is performed.

If it is determined that the cumulative film thickness value of the dummy wafer 200 selected in the dummy substrate selection step (S22) exceeds the first threshold value, it is further determined whether the cumulative film thickness value of the dummy wafer 200 exceeds a second threshold value. If it is determined that the cumulative film thickness value of the dummy wafer 200 does not exceed the second threshold value, a first warning is output to the input/output device 226 or the host device as an operation unit. Thereafter, the substrate processing is performed and the below-mentioned substrate carry-in step (S23) is executed. That is to say, if it is determined that the cumulative film thickness value of the dummy wafer 200 exceeds the first threshold value and does not exceed the second threshold value, a first warning alerting that the dummy substrate cassette 109c should be replaced is output to the input/output device 226 or the host device while the substrate processing is performed.

If it is determined that the cumulative film thickness value of the dummy wafer 200 selected in the dummy substrate selection step (S22) exceeds the second threshold value, a second warning is output to the input/output device 226 or the host device without performing the substrate processing. That is to say, if it is determined that the cumulative film thickness value of the dummy wafer 200 exceeds the second threshold value, a second warning, which indicates that the cumulative film thickness value of the dummy wafer 200 exceeds the second threshold value and further that the substrate processing will not be performed, is output to the input/output device 226 or the host device without performing the substrate processing, thereby requesting a user to replace the dummy substrate cassette 109c.

[Substrate Carry-In Step (S23)]

First, the wafer pushup pins are moved up to a transfer position of the wafer 200 while passing through the through-holes of the susceptor 217. As a result, the wafer pushup pins protrude a predetermined height beyond the surface of the susceptor 217. Subsequently, the gate valve 244a is opened and a predetermined number of (e.g., five) wafers 200 are carried into the reaction vessel 203 through the use of the vacuum transfer robot 112. In the present embodiment, either the process wafers 200 or the dummy wafers 200 are carried into the reaction vessel 203. The wafers 200 are mounted on the same plane of the susceptor 217 about the rotation shaft (not shown) of the susceptor 217 so as not to overlap with each other. Thus, the wafers 200 are horizontally supported on the wafer pushup pins protruding from the surface of the susceptor 217.

If the wafers 200 are carried into the reaction vessel 203, the vacuum transfer robot 112 is removed out of the reaction vessel 203 and the gate valve 244a is closed to seal the inside of the reaction vessel 203. Thereafter, the wafer pushup pins are moved down to mount the wafers 200 on the susceptor 217, i.e., the bottom surfaces of the first process region 201a, the first purge region 204a, the second process region 201b and the second purge region 204b. As such, the substrate transfer step (S20) according to the present embodiment is finished.

When the wafers 200 are carried into the reaction vessel 203, a $N_2$ gas as a purge gas may be supplied from the inert gas supply system into the reaction vessel 203 while evacuating the inside of the reaction vessel 203 with the exhaust unit. That is to say, while evacuating the inside of the reaction vessel 203 by operating the vacuum pump 246 and opening the APC valve 243, at least the valve 235c of the first inert gas supply system may be opened to supply a $N_2$ gas into the reaction vessel 203. This makes it possible to prevent the infiltration of the particles into the process regions 201a and 201b or to prevent the particles from being adhering to the wafers 200. At this time, inert gases may be supplied from the second inert gas supply system and the third inert gas supply system.

(Substrate Processing Step (S30))

In the substrate processing step (S30), at least a temperature rising/pressure regulating step (S31), a film forming step (S32), a purge step (S33) and a pressure regulation/substrate carry-out step (S34) are sequentially performed.

[Temperature Rising/Pressure Regulating Step (S31)]

Subsequently, the electric power is supplied to the heater 218 embedded within the susceptor 217, thereby heating the surfaces of the wafers 200 to a predetermined temperature (e.g., a temperature of 200 degree C. or more and 400 degree C. or less). At this time, the temperature of the heater 218 is adjusted by controlling the electric power supplied to the heater 218, based on the temperature information detected by the temperature sensor 274.

The inside of the reaction vessel 203 is evacuated by the vacuum pump 246 such that the internal pressure of the reaction vessel 203 becomes a desired pressure (e.g., 0.1 Pa to 300 Pa, or 20 Pa to 40 Pa). At this time, the internal pressure of the reaction vessel 203 is detected by a pressure sensor and the opening degree of the APC valve 243 is feedback controlled based on the pressure information thus detected.

While heating the wafers 200, the rotation mechanism 267 is operated to start rotating the susceptor 217. At this time, the rotation speed of the susceptor 217 is controlled by the control unit 221. The rotation speed of the susceptor 217 is, e.g., 1 revolution per second. The susceptor 217 is continuously rotated until the film forming step (S32) to be described later comes to an end. By rotating the susceptor 217, the wafers 200 begin to move through the first process region 201a, the first purge region 204a, the second process region 201b and the second purge region 204b in the named order.

[Film Forming Step (S32)]

Next, description will be made by taking, as an example, a case where a step of forming SiO films on the wafers 200 is performed by supplying a TSA gas as a first process gas into the first process region 201a and supplying an oxygen gas as a second process gas into the second process region 201b. In the following description, a process of supplying a TSA gas, a process of supplying an oxygen gas and a process of supplying an inert gas are performed in parallel.

If the wafers 200 are heated to reach a desired temperature and if the susceptor 217 reaches a desired rotation speed, at least the valves 235a, 235b and 235c are opened to start supplying a process gas and an inert gas to the process regions 201a and 201b and the purge regions 204a and 204b. That is to say, the valve 235a is opened to start supplying a TSA gas into the first process region 201a. The valve 235b is opened to supply an oxygen gas into the second process region 201b. Furthermore, the valve 235c is opened to supply a $N_2$ gas as an inert gas into the first purge region 204a and the second purge region 204b. At this time, the APC valve 243 is properly adjusted such that the internal pressure of the reaction vessel 203 falls within a pressure range of, e.g., 10 Pa to 1,000 Pa. At this time, the temperature of the heater 218 is set such that the temperature of the wafers 200 falls within a temperature range of, e.g., 200 degree C. to 400 degree C.

That is to say, the valve 235a is opened. A TSA gas is supplied from the first gas supply pipe 232a into the first process region 201a through the first process gas introduction portion 251 and the first gas spray nozzle 254, during which the TSA gas is exhausted from the exhaust pipe 231. At this time, the mass flow controller 234a controls such that the flow rate of the TSA gas becomes a predetermined flow rate. The supply flow rate of the TSA gas controlled by the mass flow controller 234a is set to fall within a flow rate range of, e.g., 100 sccm to 5,000 sccm.

When supplying the TSA gas into the first process region 201a, the valve 235d may be opened to supply a $N_2$ gas as a carrier gas or a diluting gas from the second inert gas supply pipe 232d into the first process region 201a. This makes it possible to accelerate the process of supplying the TSA gas into the first process region 201a.

Furthermore, the valve 235b is opened. An oxygen gas is supplied from the second gas supply pipe 232b into the second process region 201b through the second process gas introduction portion 252 and the second gas spray nozzle 255, during which time the oxygen gas is exhausted from the exhaust pipe 231. At this time, the mass flow controller 234b controls such that the flow rate of the oxygen gas becomes a predetermined flow rate. The supply flow rate of the oxygen gas controlled by the mass flow controller 234b is set to fall within a flow rate range of, e.g., 1,000 sccm to 10,000 sccm.

When supplying the oxygen gas into the second process region 201b, the valve 235e may be opened to supply a $N_2$ gas as a carrier gas or a diluting gas from the third inert gas supply pipe 232e into the second process region 201b. This makes it possible to accelerate the process of supplying the oxygen gas into the second process region 201b.

While opening the valves 235a and 235b, the valve 235c may also be opened. An $N_2$ gas, i.e., an inert gas as a purge gas, is supplied from the first inert gas supply pipe 232c into the first purge region 204a and the second purge region 204b through the inert gas introduction portion 253, the first inert gas spray nozzle 256 and the second inert gas spray nozzle 257, during which the $N_2$ gas is exhausted. At this time, the mass flow controller 234c controls such that the flow rate of the $N_2$ gas becomes a predetermined flow rate. A clearance is formed between the end portion of each of the partition plates 205 and the sidewall of the reaction vessel 203. By spraying an inert gas from the insides of the first purge region 204a and the second purge region 204b or the clearance toward the insides of the first process region 201a and the second process region 201b, it is possible to suppress the infiltration of a process gas into the first purge region 204a and the second purge region 204b.

While the gas is started to being supplied, the high-frequency electric power is simultaneously supplied from a high-frequency power supply (not shown) to the plasma generating unit 206 installed above the second process region 201b. The oxygen gas supplied into the second process region 201b and passed through below the plasma generating unit 206 is converted to plasma. Active species contained in the plasma is supplied to the wafers 200. The high-frequency electric power applied from the high-frequency power supply is set to fall within a power range of, e.g., 50 W to 1,000 W.

The oxygen gas is high in reaction temperature and is hard to react at the processing temperature of the wafers 200 and the internal pressure of the reaction vessel 203 mentioned above. However, if the oxygen gas is converted to plasma and the active species contained in the plasma are supplied to the wafers 200 as in the present embodiment, it is possible to perform a film forming process even at a temperature range of, e.g., 400 degree C. or less. In case where the processing temperatures required in the first process gas and the second process gas are different from each other, the heater 218 may be controlled in conformity with the temperature of the process gas having a lower processing temperature. The other process gas whose processing temperature needs to be increased may be supplied in a plasma state. Thus, the use of plasma makes it possible to process the wafers 200 at a low temperature. It is therefore possible to process wafers 200 having a thermally weak wiring line such as an aluminum wiring line or the like. It is also possible to prevent the generation of foreign substances such as products generated by the incomplete reaction of a process gas. This makes it possible to improve the homogeneity and the voltage resistance property of a thin film formed on the wafer 200. In addition, the high oxidizing power of the oxygen gas in a plasma state makes it possible to shorten the oxidation process time and to improve the substrate processing productivity.

As described above, as the susceptor 217 rotates, the wafers 200 are repeatedly moved through the first process region 201a, the first purge region 204a, the second process region 201b and the second purge region 204b in the named order. Consequently, as shown in 7, the process of supplying a TSA gas, the process of supplying (purging) a $N_2$ gas, the process of supplying an oxygen gas converted to plasma and the process of supplying (purging) of a $N_2$ gas are alternately performed with respect to the wafers 200 a predetermined number of times.

First, a TSA gas is supplied on the surface of the wafer 200 passing through the first process region 201a, whereby a silicon-containing layer is formed on the wafer 200.

Then, the wafer 200 having the silicon-containing layer passes through the first purge region 204a. At this time, a $N_2$ gas as an inert gas is supplied to the wafer 200.

Subsequently, an oxygen gas is supplied to the wafer 200 passing through the second process region 201b, whereby a silicon oxide layer (a SiO layer) is formed on the wafer 200. That is to say, the oxygen gas reacts with a portion of the silicon-containing layer formed on the wafer 200 in the first process region 201a. Thus, the silicon-containing layer is oxidized and is modified to a SiO layer which contains silicon and oxygen.

Then, the wafer 200 having the SiO layer formed in the second process region 201b passes through the second purge region 204b. At this time, a $N_2$ gas as an inert gas is supplied to the wafer 200.

In such a manner, one revolution of the susceptor 217 is set as one cycle. That is to say, the passage of the wafer 200 through the first process region 201a, the first purge region 204a, the second process region 201b and the second purge region 204b is set as one cycle. By performing this cycle at least once, a SiO film having a predetermined film thickness can be formed on the wafer 200.

After the SiO film having a predetermined film thickness is formed on the wafer 200, at least the valves 234a and 235b are closed to stop the process of supplying the TSA gas and the oxygen gas into the first process region 201a and the second process region 201b. At this time, the supply of electric power to the plasma generating unit 206 is also stopped. Moreover, the supply of electric power to the heater 218 is stopped.

[Purge Step (S33)]

After stopping the process of supplying the TSA gas into the first process region 201a and the process of supplying the oxygen gas into the second process region 201b, the valves 235d and 235e are opened to supply a $N_2$ gas into the first process region 201a and the second process region 201b. Thus, the inside of the first process region 201a and the inside of the second process region 201b are purged by the $N_2$ gas to remove the residual gases remaining within the first process region 201a and the second process region 201b.

[Pressure Regulation/Substrate Carry-Out Step (S34)]

If the purge is finished, the opening degree of the APC valve 243 is adjusted such that the internal pressure of the reaction vessel 203 becomes a predetermined pressure. When the film forming step (S32) is completed, the wafer pushup pins are moved up and the wafers 200 are supported on the wafer pushup pins protruding from the surface of the susceptor 217. Then, the gate valve 244a is opened and the wafers 200 are carried out of the reaction vessel 203 through the use of the vacuum transfer robot 112. As such, the substrate processing step (S30) according to the present embodiment is terminated. In the substrate processing step (S30), conditions such as the temperature of the wafers 200, the internal pressure of the reaction vessel 203, the flow rates of the respective gases, the electric power applied to electrodes of the plasma generating unit 206 and the processing time are arbitrarily adjusted depending on the film thickness or the like.

(Film Thickness Value Renewal Step (S40))

After the substrate processing step (S30) is terminated, the cumulative film thickness value for each of the dummy wafers 200 is renewed by the calculation unit.

Then, determination is made as to whether processing has been performed with respect to all the process wafers 200 accommodated in the process substrate cassette 109a. If the processing for all the process wafers 200 is not completed, the substrate transfer step (S20) and the substrate processing step (S30) are repeatedly performed. If the processing for all the process wafers 200 accommodated in the process substrate cassette 109a is completed, the process substrate cassette 109a for accommodating unprocessed process wafers 200 therein and the process substrate cassette 109b for accommodating processed process wafers 200 therein are carried from the load port 105. The load port 105 is on standby until the next process substrate cassettes 109a and 109b are transferred thereto.

(Third Threshold Value Based Determination Step)

After the processing for all the process wafers 200 accommodated in the process substrate cassette 109a is terminated, namely after the processing for one lot of wafers 200 is terminated, determination is made as to whether an average value of the cumulative film thickness values of the dummy wafers 200 accommodated in the dummy substrate cassette 109c exceeds a third threshold value. More specifically, in the present embodiment, after the process substrate cassette 109a, in which all the process wafers 200 have been processed, is transferred from the load port 105 to the next station and after a process substrate cassette 109a in which new unprocessed process wafers 200 are accommodated is mounted on the load port 105 (after the cassette mounting step (S10) is terminated), determination is made as to whether an average value of the cumulative film thickness values of the dummy wafers 200 exceeds a third threshold value.

If it is determined that the average value of the cumulative film thickness value of all the dummy wafers 200 accommodated in the dummy substrate cassette 109c exceeds the third threshold value, a third warning is output to the input/output device 226 or the host device without performing the processing of the process wafers 200 accommodated in the process substrate cassette 109a expected to be processed next time. That is to say, if it is determined that the average value of the cumulative film thickness value of the dummy wafers 200 exceeds the third threshold value, a third warning which indicates that the cumulative film thickness value of the dummy wafer 200 exceeds the third threshold value and further that the substrate processing for the process wafers 200 accommodated in the newly-transferred process substrate cassette 109a will not be performed, is output to the input/output device 226 or the host device, thereby requesting a user to replace the dummy substrate cassette 109c.

(4) Effects According to the Present Embodiment

According to the present embodiment, there are provided one or more effects to be set forth below.

(a) According to the present embodiment, when mounting the wafers 200 on the susceptor 217, the number of unprocessed process wafers 200 accommodated in the process substrate cassette 109a is detected and the number of dummy wafers 200 to be carried into the process chamber 202a is determined. In such a manner, one or more process wafers 200 and one or more dummy wafers 200 are mounted on all the substrate mounting surfaces of the mounting portions 217a defined on the surface of the susceptor 217. This makes it difficult for films to be formed on the substrate mounting surfaces. Accordingly, when the next lots of wafers 200 are mounted, even if the wafers 200 are slid along the substrate mounting surfaces by a centrifugal force at the start of rotation, it is less likely that the rear surfaces of substrates make contact with films. It is therefore possible to prevent films from being separated and foreign substances (particles) from being generated.

(b) According to the present embodiment, the control unit 221 is provided with a calculation unit that calculates a cumulative film thickness value of each of the dummy wafers 200. The control of the transfer processing of the wafers 200 (the process wafers and the dummy wafers) performed by the transfer unit and the determination whether or not to perform the substrate processing within the process chamber are executed based on the cumulative film thickness value of each of the dummy wafers 200 calculated by the calculation unit. This makes it possible to prevent the film separation caused by the increase of the cumulative film thickness value of each of the dummy wafers 200, thereby preventing particles from being generated and improving the substrate processing quality.

(c) According to the present embodiment, if it is determined that there is a need to carry dummy wafers 200 into the process chamber (the reaction vessel 203) in the next substrate processing, the dummy wafer 200 having a smallest cumulative film thickness value is preferentially selected from the dummy wafers 200 accommodated in the dummy substrate cassette 109c and is carried into the process chamber by the transfer unit during the transfer processing of the wafers 200. This makes it possible to prevent the film separation caused by the increase of the cumulative film thickness value of each of the dummy wafers 200, thereby preventing particles from being generated. In addition, the dummy wafers 200 accommodated in the dummy substrate cassette 109c can be used evenly. This makes it possible to reduce the frequency for replacing the dummy substrate cassette 109c.

(d) According to the present embodiment, a plurality of predetermined threshold values set with respect to the cumulative film thickness values of the dummy wafers 200 is pre-stored in the control unit 221. When the substrate processing is performed, determination is made as to whether the cumulative film thickness values of the dummy wafers 200 carried into the process chamber exceeds the respective predetermined threshold values. If the cumulative film thickness values of the dummy wafers 200 carried into the process chamber exceeds the predetermined threshold values, the substrate processing may not be performed. This makes it possible to prevent the substrate processing from being performed through the use of the dummy wafers 200 having a film thickness exceeding a predetermined cumulative film thickness value. Accordingly, it is possible to prevent the film separation caused by the increase of the cumulative film thickness value of each of the dummy wafers 200, thereby preventing particles from being generated. In addition, it becomes easy to prevent warp or deformation of the dummy wafer 200 caused by the stress of a deposited film. It is therefore possible to preventing particles from being generated, which may be caused by, e.g., a deformed dummy wafer 200 being rubbed with the susceptor 217 or other peripheral members.

(e) According to the present embodiment, if the cumulative film thickness values of the dummy wafers 200 exceed the predetermined threshold values, a warning corresponding to each of the predetermined threshold values is output to the input/output device 226 or the host device while making determination as to whether the substrate processing is executable. This makes it possible to prevent an occurrence of a management error, e.g., an error of not timely replacing the dummy substrate cassette 109c. Thus, it becomes easy to prevent the substrate processing from being performed through the use of the dummy wafer 200 having a film thickness exceeding a predetermined cumulative film thickness value.

<Other Embodiments of the Present Disclosure>

While one embodiment of the present disclosure has been specifically described above, the present disclosure is not limited to the aforementioned embodiment but may be differently modified without departing from the spirit of the disclosure.

In the aforementioned embodiment, description has been made on the case where a warning which alerts that the dummy substrate cassette 109c should be replaced is issued as a first warning, a warning, which indicates that the cumulative film thickness value of the dummy wafer 200 exceeds a second threshold value and further that the substrate processing will not be performed, is issued as a second warning, and a warning, which indicates that an average value of the cumulative film thickness values of the dummy wafers 200 exceeds a third threshold value and further that the substrate processing will not be performed with respect to the process wafers 200 accommodated in a newly-transferred process substrate cassette 109a, is issued as a third warning. However, the present disclosure is not limited thereto. That is to say, for example, three predetermined threshold values, namely a first threshold value, a second threshold value and a third threshold value, which are set with respect to the cumulative film thickness value of the dummy wafer 200, may be pre-stored in the control unit 221 as follows. When performing the substrate processing, if the cumulative film thickness value of the dummy wafer 200 carried into the process chamber exceeds the first threshold value, a warning which alerts that the dummy substrate cassette 109c should be replaced may be issued as a first warning. If the cumulative film thickness value of the dummy wafer 200 exceeds the second threshold value, a warning which indicates that, if the next substrate processing is performed, the cumulative film thickness values of all the dummy wafers 200 accommodated in the dummy substrate cassette 109c are highly likely to exceed the third threshold value, may be issued as a second warning. If the cumulative film thickness value of the dummy wafer 200 exceeds the third threshold value, a warning which alerts that the substrate processing will not be requested may be issued as a third warning.

In the aforementioned embodiment, after the processing of all the process wafers 200 accommodated in the process substrate cassette 109a is terminated and after the next process substrate cassette 109a is mounted on the load port 105, determination is made as to whether an average value of the cumulative film thickness values of the dummy wafers 200 accommodated in the dummy substrate cassette 109c exceeds the third threshold value. However, the present disclosure is not limited thereto. For example, immediately after the processing of all the process wafers 200 accommodated in one process substrate cassette 109a is terminated, determination may be made as to whether an average value of the cumulative film thickness values of the dummy wafers 200 accommodated in the dummy substrate cassette 109c exceeds the third threshold value. That is to say, before the processing of the process wafers 200 accommodated in the next process substrate cassette 109a is started, determination may be made as to whether an average value of the cumulative film thickness values of the dummy wafers 200 accommodated in the dummy substrate cassette 109c exceeds the third threshold value.

In the aforementioned embodiment, three predetermined threshold values, namely a first threshold value, a second threshold value and a third threshold value, are pre-stored as the plurality of predetermined threshold values which are set with respect to the cumulative film thickness value of the dummy wafer 200. Depending on the respective predetermined threshold values, a first warning, a second warning or a third warning is issued along with the determinant ion whether or not to perform the substrate processing. However, the present disclosure is not limited thereto. That is to say, for example, two predetermined threshold values, namely a first threshold value and a second threshold value, may be pre-stored as the plurality of predetermined threshold values. Depending on the respective predetermined threshold values, at least one of a first warning and a second warning may be issued along with the determination whether or not to perform the substrate processing. Alternatively, four or more threshold values may be pre-stored as the plurality of predetermined threshold values. Depending on the respective predetermined threshold values, four or more warnings may be issued along with the determination whether or not to perform the substrate processing.

In the aforementioned embodiment, description has been made on the case where the cumulative film thickness value of the dummy wafer 200 carried into the process chamber exceeds a predetermined threshold value. However, the present disclosure is not limited thereto. For example, a warning may be issued in case where an average value of the cumulative film thickness values of the dummy wafers 200 accommodated in the dummy substrate cassette 109c exceeds a predetermined threshold value. Alternatively, a warning may be issued in case where the cumulative film thickness value of the dummy wafer 200 having a smallest cumulative film thickness value, among the dummy wafers 200 accommodated in the dummy substrate cassette 109c, exceeds a predetermined threshold value.

In the aforementioned embodiment, the cumulative film thickness value is calculated by multiplying the thickness of a film formed after one substrate processing is executed with the substrate processing execution frequency. However, for example, the cumulative film thickness value may be calculated based on a cumulative film formation time of each of the dummy wafer 200 or may be calculated depending on whether the film formation execution frequency of the dummy wafer 200 reaches a predetermined frequency.

In the aforementioned embodiment, description has been made on the case where both the control of the transfer processing of the wafer 200 performed by the transfer unit and the determination whether or not to perform the substrate processing within the process chamber are executed. However, at least one of the control of the transfer processing of the wafer 200 and the determination whether or not to perform the substrate processing may be executed.

In the aforementioned embodiment, the warning is displayed on the input/output device 226 or the host device. However, the present disclosure is not limited thereto. For example, the warning may be issued by a warning lamp, a warning sound or the combination thereof.

In the aforementioned embodiment, description has been made on the multiple-wafer-type substrate processing apparatus. However, the present disclosure is not limited thereto. The present disclosure can be applied to a substrate processing apparatus in which fill dummy wafers are used to eliminate a difference between the number of wafers 200 mountable on the substrate support unit and the number of process wafers 200 actually mounted on the substrate support unit. That is to say, for example, the present disclosure may be applied to a vertical substrate processing apparatus that performs substrate processing with respect to a plurality of wafers 200 arranged in a horizontal posture with the centers thereof aligned with one other and held on a substrate support member at multiple stages along a vertical direction, or various kinds of other multiple-wafer-type substrate processing apparatuses.

In the aforementioned embodiment, description has been made on the case where the wafers 200 such as the process wafers and the dummy wafers are first transferred from the cassettes 109a and 109c to the load lock chambers 122 and 123 as preparatory chambers and are then transferred from the preparatory chambers into the process chamber (the reaction vessel 203) through the vacuum transfer chamber 103. However, the present disclosure is not limited thereto. For example, the wafers 200 may be directly transferred from each of the process substrate cassette 109a and the dummy substrate cassette 109c to the process chamber.

In the aforementioned embodiment, description has been made on the case where the present disclosure is applied to the substrate processing apparatus 100 for forming specified thin films (SiO films) on the wafers 200. However, the present disclosure is not limited thereto. For example, the present disclosure may be applied to a substrate processing apparatus for forming nitride films on the wafers 200 or an impurity doping apparatus for adding impurity atoms to the wafers 200.

In the aforementioned embodiment, description has been made on the case where the present disclosure is applied to the substrate processing apparatus for processing the wafers 200. However, the present disclosure is not limited thereto. That is to say, for example, the present disclosure can be applied to a substrate processing apparatus such as an LCD (Liquid Crystal Display) manufacturing apparatus for processing a glass substrate, or the like.

<Exemplary Aspects of the Present Disclosure>

Some aspects of the present disclosure will now be described.

According to one aspect of the present disclosure, there is provided a substrate processing apparatus, including: a cassette mounting unit on which a process substrate cassette and a dummy substrate cassette are mounted, the process substrate cassette being configured to accommodate a plurality of process substrates, and the dummy substrate cassette being configured to accommodate a plurality of dummy substrates; a process chamber configured to process the process substrates, the dummy substrates or the process substrates and the dummy substrates; a substrate support unit installed within the process chamber and provided with a plurality of substrate mounting portions arranged on the same plane of the substrate support unit, the substrate mounting portions including substrate mounting surfaces on which the process substrates and the dummy substrates are mounted; a gas supply unit configured to supply a process gas into the process chamber; an exhaust unit configured to evacuate an inside of the process chamber; a transfer unit configured to transfer the process substrates and the dummy substrates between the cassette mounting unit and the process chamber; and a control unit configured to control substrate processing performed within the process chamber and transfer processing of the process substrates and the dummy substrates performed by the transfer unit.

The control unit may include a calculation unit configured to calculate a cumulative film thickness value for each of the dummy substrates, and be configured to execute at least one of a control of the transfer processing performed by the transfer unit and a determination whether or not to perform the substrate processing within the process chamber based on the cumulative film thickness value calculated by the calculation unit.

If at least one dummy substrate is determined to be carried into the process chamber for a subsequent substrate processing, the control unit may control such that, when the transfer processing is performed, a dummy substrate having a smallest cumulative film thickness value is preferentially selected from the dummy substrates accommodated in the dummy substrate cassette and is carried into the process chamber by the transfer unit.

The control unit stores a first threshold value which is set with respect to the cumulative film thickness value for each of the dummy substrates, and the control unit controls such that, if a cumulative film thickness value of a dummy substrate to be carried into the process chamber among the dummy substrates accommodated in the dummy substrate cassette exceeds the first threshold value, a warning alerting to replace the dummy substrate cassette is output to an operation unit or a host device.

The control unit stores a second threshold value which is set with respect to the cumulative film thickness value for each of the dummy substrates, and the control unit controls such that, if a cumulative film thickness value of a dummy substrate to be carried into the process chamber among the dummy substrates accommodated in the dummy substrate cassette exceeds the second threshold value, a warning which indicates that the cumulative film thickness value of the dummy substrate exceeds the second threshold value is output to an operation unit or a host device without performing the substrate processing.

The control unit stores a third threshold value which is set with respect to the cumulative film thickness value for each of the dummy substrates, and the control unit controls such that, if an average value of cumulative film thickness values of all the dummy substrates accommodated in the dummy substrate cassette exceeds the third threshold value after processing of all the process substrates accommodated in the process substrate cassette has been completed, a warning which indicates that the average value of the cumulative film thickness values of all the dummy substrates exceeds the third threshold value is output to an operation unit or a host device without processing process substrates which are accommodated in the process substrate cassette expected to be processed next time.

The substrate support unit is configured to be rotatable, and the substrate mounting portions are arranged on a circumferential portion on a surface of the substrate support unit along a rotation direction of the substrate support unit and include recess portions having bottom sections depressed from the surface of the substrate support unit so as to serve as the substrate mounting surfaces.

The substrate support unit is configured to be rotatable, and the substrate mounting portions include the recess portions having the bottom sections depressed from the surface of the substrate support unit so as to serve as the substrate mounting surfaces, whereby, when the substrate processing is performed within the process chamber, the process substrates or the dummy substrates slid along the substrate mounting surfaces by a centrifugal force during rotation of the substrate support unit may stay within the recess portions.

According to another aspect of the present disclosure, there is provided a semiconductor device manufacturing method, including: mounting, on a cassette mounting unit, a process substrate cassette, into which a plurality of process substrates is accommodated, and a dummy substrate cassette, into which a plurality of dummy substrates is accommodated; detecting a number of unprocessed process substrates among the process substrates accommodated in the process substrate cassette and determining a number of dummy substrates to be carried into the process chamber; selecting the number of dummy substrates to be carried from the dummy substrate cassette into the process chamber based on a cumulative film thickness value for each of the plurality of dummy substrates calculated by a calculation unit; transferring the process substrates and the number of dummy substrates into the process chamber using a transfer unit, and mounting the process substrates and the number of dummy substrates transferred into the process chamber on all substrate mounting surfaces of a plurality of substrate mounting portions, the plurality of substrate mounting portions being arranged on the same plane of a surface of a substrate support unit which is installed within the process chamber; and supplying a process gas into the process chamber using a gas supply unit so as to process the process substrates and the number of dummy substrates.

When selecting the number of dummy substrates, the number of dummy substrates to be carried into the process chamber may be selected based on the cumulative film thickness value for each of the dummy substrates calculated by the calculation unit and, when transferring the process substrates and the number of dummy substrates, a determination whether or not to perform the substrate processing may be made based on the cumulative film thickness value for each of the number of dummy substrates prior to transferring the process substrates and the number of dummy substrates into the process chamber.

According to a further aspect of the present disclosure, there is provided a substrate processing method, including: mounting, on a cassette mounting unit, a process substrate cassette, into which a plurality of process substrates is accommodated, and a dummy substrate cassette, into which a plurality of dummy substrates is accommodated; detecting a number of unprocessed process substrates among the process substrates accommodated in the process substrate cassette and determining a number of dummy substrates to be carried into the process chamber; selecting the number of dummy substrates to be carried from the dummy substrate cassette into the process chamber based on a cumulative film thickness value for each of the plurality of dummy substrates calculated by a calculation unit; transferring the process substrates and the number of dummy substrates into the process chamber using a transfer unit, and mounting the process substrates and the number of dummy substrates transferred into the process chamber on all substrate mounting surfaces of a plurality of substrate mounting portions, the plurality of substrate mounting portions being arranged on the same plane of a surface of a substrate support unit which is installed within the process chamber; and supplying a process gas into the process chamber by a gas supply unit so as to process the process substrates and the number of dummy substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

EXPLANATION OF REFERENCE NUMERALS

100: substrate processing apparatus, 105: load port (cassette mounting stand), 109a and 109b: process substrate cassette, 109c: dummy substrate cassette, 200: wafer (substrate), 221: controller (control unit), 231: exhaust pipe, 250: gas supply unit

What is claimed is:
1. A semiconductor device manufacturing method, comprising:
mounting, on a cassette mounting unit, a process substrate cassette, into which a plurality of process substrates is accommodated, and a dummy substrate cassette, into which a plurality of dummy substrates is accommodated;

detecting a number of unprocessed process substrates among the process substrates accommodated in the process substrate cassette and determining a number of dummy substrates to be carried into a process chamber;

selecting the number of dummy substrates to be carried from the dummy substrate cassette into the process chamber based on a cumulative film thickness value for each of the plurality of dummy substrates calculated by a calculation unit;

determining whether the cumulative film thickness value for each of the number of dummy substrates exceeds a first threshold value without exceeding a second threshold value higher than the first threshold value;

outputting a first warning to an operation unit or a host device unit if the cumulative film thickness value for each of the number of dummy substrates is determined to exceed the first threshold value without exceeding the second threshold value;

determining whether the cumulative film thickness value for each of the number of dummy substrates exceeds the second threshold value if it is determined the cumulative film thickness value exceeds the first threshold value;

if it is determined that the cumulative film thickness value for each of the number of dummy substrates exceeds the second threshold value, outputting a second warning to the operation unit or the host device unit without transferring the process substrates and the number of dummy substrates into the processing chamber; and if it is determined that the cumulative film thickness value for each of the number of dummy substrates does not exceed the second threshold value:

transferring the process substrates and the number of dummy substrates into the process chamber using a transfer unit, and mounting the process substrates and the number of dummy substrates transferred into the process chamber on all substrate mounting surfaces of a plurality of substrate mounting portions, the substrate mounting portions being arranged on the same plane of a surface of a substrate support unit which is installed within the process chamber; and supplying a process gas into the process chamber by a gas supply unit so as to process the process substrates and the number of dummy substrates after transferring the process substrates and the number of dummy substrates into the process chamber.

2. The method of claim 1, wherein transferring the process substrates and the number of dummy substrates includes determining whether or not to perform substrate processing based on the cumulative film thickness value for each of the number of dummy substrates prior to transferring the process substrates and the number of dummy substrates into the process chamber.

3. The method of claim 1, wherein selecting the number of dummy substrates includes preferentially selecting a dummy substrate having a smallest cumulative film thickness value from the plurality of dummy substrates accommodated in the dummy substrate cassette.

4. The method of claim 1, further comprising:
determining whether an average value of the cumulative film thickness values of the dummy substrates accommodated in the dummy substrate cassette exceeds a third threshold value after mounting the process substrate cassette on the cassette mounting unit; and outputting a third warning to an operation unit or a host device unit without transferring the process substrates into the processing chamber if the average value of the cumulative film thickness values of the dummy substrates accommodated in the dummy substrate cassette exceeds the third threshold value.

5. A substrate processing method, comprising:
mounting, on a cassette mounting unit, a process substrate cassette, into which a plurality of process substrates is accommodated, and a dummy substrate cassette, into which a plurality of dummy substrates is accommodated;

detecting a number of unprocessed process substrates among the process substrates accommodated in the process substrate cassette and determining a number of dummy substrates to be carried into a process chamber;

selecting the number of dummy substrates to be carried from the dummy substrate cassette into the process chamber based on a cumulative film thickness value for each of the plurality of dummy substrates calculated by a calculation unit;

determining whether the cumulative film thickness value for each of the number of dummy substrates exceeds a first threshold value without exceeding a second threshold value higher than the first threshold value;

outputting a first warning to an operation unit or a host device unit if the cumulative film thickness value for each of the number of dummy substrates is determined to exceed the first threshold value without exceeding the second threshold value;

determining whether the cumulative film thickness value for each of the number of dummy substrates exceeds the second threshold value if it is determined the cumulative film thickness value exceeds the first threshold value;

if it is determined that the cumulative film thickness value for each of the number of dummy substrates exceeds the second threshold value, outputting a second warning to the operation unit or the host device unit without transferring the process substrates and the number of dummy substrates into the processing chamber; and if it is determined that the cumulative film thickness value for each of the number of dummy substrates does not exceed the second threshold value:

transferring the process substrates and the number of dummy substrates into the process chamber using a transfer unit, and mounting the process substrates and the number of dummy substrates transferred into the process chamber on all substrate mounting surfaces of a plurality of substrate mounting portions, the plurality of substrate mounting portions being arranged on the same plane of a surface of a substrate support unit which is installed within the process chamber; and supplying a process gas into the process chamber by a gas supply unit so as to process the process substrates and the number of dummy substrates after transferring the process substrates and the number of dummy substrates into the process chamber.

6. The method of claim 5, wherein selecting the number of dummy substrates includes preferentially selecting a dummy substrate having a smallest cumulative film thickness value from the plurality of dummy substrates accommodated in the dummy substrate cassette.

7. The method of claim 5, further comprising:
determining whether an average value of the cumulative film thickness values of the dummy substrates accommodated in the dummy substrate cassette exceeds a third threshold value after mounting the process substrate cassette on the cassette mounting unit; and outputting a third warning to an operation unit or a host device unit without transferring the process substrates into the processing chamber if the average value of the cumulative film thickness values of the dummy substrates accommodated in the dummy substrate cassette exceeds the third threshold value.

8. A non-transitory computer-readable recording medium which stores a program for causing a computer to execute:

mounting, on a cassette mounting unit, a process substrate cassette, into which a plurality of process substrates is accommodated, and a dummy substrate cassette, into which a plurality of dummy substrates is accommodated;

detecting a number of unprocessed process substrates among the process substrates accommodated in the process substrate cassette and determining a number of dummy substrates to be carried into a process chamber;

selecting the number of dummy substrates to be carried from the dummy substrate cassette into the process chamber based on a cumulative film thickness value for each of the plurality of dummy substrates calculated by a calculation unit;

determining whether the cumulative film thickness value for each of the number of dummy substrates exceeds a first threshold value without exceeding a second threshold value higher than the first threshold value;

outputting a first warning to an operation unit or a host device unit if the cumulative film thickness value for each of the number of dummy substrates is determined to exceed the first threshold value without exceeding the second threshold value;

determining whether the cumulative film thickness value for each of the number of dummy substrates exceeds the second threshold value if it is determined the cumulative film thickness value exceeds the first threshold value;

if it is determined that the cumulative film thickness value for each of the number of dummy substrates exceeds the second threshold value, outputting a second warning to the operation unit or the host device unit without transferring the process substrates and the number of dummy substrates into the processing chamber; and if it is determined that the cumulative film thickness value for each of the number of dummy substrates does not exceed the second threshold value:

transferring the process substrates and the number of dummy substrates into the process chamber using a transfer unit, and mounting the process substrates and the number of dummy substrates transferred into the process chamber on all substrate mounting surfaces of a plurality of substrate mounting portions, the plurality of substrate mounting portions being arranged on the same plane of a surface of a substrate support unit which is installed within the process chamber; and supplying a process gas into the process chamber by a gas supply unit so as to process the process substrates and the number of dummy substrates after transferring the process substrates and the number of dummy substrates into the process chamber.

9. The recording medium of claim 8, wherein selecting the number of dummy substrates includes preferentially selecting a dummy substrate having a smallest cumulative film thickness value from the plurality of dummy substrates accommodated in the dummy substrate cassette.

10. The method of claim 8, further comprising:

determining whether an average value of the cumulative film thickness values of the dummy substrates accommodated in the dummy substrate cassette exceeds a third threshold value after mounting the process substrate cassette on the cassette mounting unit; and outputting a third warning to an operation unit or a host device unit without transferring the process substrates into the processing chamber if the average value of the cumulative film thickness values of the dummy substrates accommodated in the dummy substrate cassette exceeds the third threshold value.

* * * * *